US009592959B2

(12) United States Patent
Kinugawa et al.

(10) Patent No.: US 9,592,959 B2
(45) Date of Patent: Mar. 14, 2017

(54) ARTICLE TRANSPORT FACILITY WITH INTERMEDIATE RACK

(71) Applicant: Daifuku Co., Ltd., Osaka-shi, Osaka (JP)

(72) Inventors: Tomotaka Kinugawa, Shiga (JP); Suguru Shibata, Komaki (JP); Daisuke Ogawa, Komaki (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 14/639,690

(22) Filed: Mar. 5, 2015

(65) Prior Publication Data

US 2015/0307277 A1    Oct. 29, 2015

Related U.S. Application Data

(63) Continuation of application No. 13/582,610, filed as application No. PCT/JP2010/073672 on Dec. 28, 2010, now Pat. No. 9,004,840.

(30) Foreign Application Priority Data

Mar. 8, 2010  (JP) ................................. 2010-050694
Jul. 23, 2010  (JP) ................................. 2010-166303

(51) Int. Cl.
*H01L 21/677* (2006.01)
*B65G 1/06* (2006.01)
(Continued)

(52) U.S. Cl.
CPC ........... *B65G 1/065* (2013.01); *B65G 1/0464* (2013.01); *B66C 19/00* (2013.01);
(Continued)

(58) Field of Classification Search
CPC ..................... B65G 1/0464; H01L 21/67733
See application file for complete search history.

(56) References Cited

U.S. PATENT DOCUMENTS 7,413,396 B2 *  8/2008  Ito ........................ B65G 1/045
                                                        414/626
7,891,929 B2     2/2011  Yamamoto et al.
(Continued)

FOREIGN PATENT DOCUMENTS

JP          10109887 A      4/1998
JP          10250835 A      9/1998
(Continued)

*Primary Examiner* — Gerald McClain
(74) *Attorney, Agent, or Firm* — The Webb Law Firm

(57) ABSTRACT

An intermediate transfer device is located upwardly of an article delivering and receiving portion and downwardly of a ceiling transport vehicle. A transfer device grip is provided such that the intermediate transfer device is in vertical alignment with the ceiling transport vehicle and the article delivering and receiving portion and is capable of traveling, while guided and supported by a guiding support, to and among a transfer position for the delivering and receiving portion, a transfer position for the intermediate rack, a transfer-time retracted position, and a temporary-storage-time retracted. The guiding support is configured to form a space through which the grip portion and an article can pass in the vertical direction when the ceiling transport vehicle transfers the article.

5 Claims, 14 Drawing Sheets

(51) Int. Cl.
  *B65G 1/04*     (2006.01)
  *H01L 21/687*   (2006.01)
  *B66C 19/00*    (2006.01)

(52) U.S. Cl.
  CPC .. *H01L 21/67733* (2013.01); *H01L 21/67736* (2013.01); *H01L 21/67769* (2013.01); *H01L 21/68707* (2013.01); *B65G 2201/0297* (2013.01)

(56) References Cited

U.S. PATENT DOCUMENTS

| | | | | |
|---|---|---|---|---|
| 8,043,039 | B2* | 10/2011 | Yamamoto | H01L 21/67766 414/217 |
| 2004/0047714 | A1* | 3/2004 | Poli | H01L 21/67775 414/281 |
| 2007/0059131 | A1* | 3/2007 | Yoshitaka | B65G 37/02 414/217 |
| 2008/0014061 | A1* | 1/2008 | Izumi | H01L 21/67766 414/281 |
| 2009/0060697 | A1* | 3/2009 | Wakabayashi | H01L 21/67733 414/564 |
| 2010/0003111 | A1* | 1/2010 | Yeo | H01L 21/67775 414/222.07 |
| 2010/0202861 | A1* | 8/2010 | Sawado | H01L 21/67724 414/222.02 |

FOREIGN PATENT DOCUMENTS

| | | | |
|---|---|---|---|
| JP | 2003051527 | A | 2/2003 |
| JP | 2005136294 | A | 5/2005 |
| JP | 2005150129 | A | 6/2005 |
| JP | 2006224944 | A | 8/2006 |
| JP | 2007331906 | A | 12/2007 |
| JP | 2012193033 | A * | 10/2012 |

* cited by examiner

ARTICLE TRANSPORT FACILITY WITH INTERMEDIATE RACK

CROSS REFERENCE TO RELATED APPLICATIONS

This application is a continuation of U.S. patent application Ser. No. 13/582,610, filed Nov. 16, 2012 and entitled "Article Transport Facility With Intermediate Transfer Device", which is a national phase application of PCT Application No. PCT/JP2010/073672 which claims priority to JP 2010-050694 and JP 2010-166303, filed on Mar. 8, 2010 and Jul. 23, 2010, respectively; the disclosures of all the applications are each incorporated herein by reference.

FIELD OF THE INVENTION

The present invention relates to an article transport facility comprising a ceiling transport vehicle that is capable of traveling along a travel rail arranged on a ceiling side, that includes a grip portion for supporting an article such that the grip portion can be vertically moved, and that is capable of transferring an article to or from an article delivering and receiving portion provided on a floor side; and an intermediate rack for temporarily storing an article to be transferred to the article delivering and receiving portion, the intermediate rack being located upwardly of the article delivering and receiving portion and downwardly of the ceiling transport vehicle.

BACKGROUND OF THE INVENTION

Since, among other reasons, article handling throughput of an article delivering and receiving portion increases when a number of article transfer operations to or from the article delivering and receiving portion are performed in a row by ceiling transport vehicles, the ceiling transport vehicles that need to transfer articles to or from the article delivering and receiving portion end up forming a waiting line, which may result in a traffic congestion of the ceiling transport vehicles on the travel rail. To this end, intermediate racks for temporarily storing articles to be transferred to or from an article delivering and receiving portion are conventionally provided to prevent such congestion among the ceiling transport vehicles. (See, for example, Patent Document 1.)

In the article transport facility disclosed in Patent Document 1, a transport carriage 16 that functions as a ceiling transport vehicle is configured to be able to transfer an article to or from storage shelves 3-1 to 3-8 that function as intermediate racks by vertically moving fingers 164 that function as a grip portion. Traffic congestions of the ceiling transport vehicles can be prevented in the article transport facility disclosed in Patent Document 1 by virtue of the fact that the ceiling transport vehicles transfer articles to or from the intermediate racks; however, the ceiling transport vehicles can transfer articles only to or from the intermediate racks. More particularly, each intermediate rack is located in a position that is between a ceiling transport vehicle and an article delivering and receiving portion, and that is in vertical alignment, or overlaps vertically, with these; thus, an article cannot be directly transferred to the carrying-in port 51a and from the taking-out port 51b that function as article delivering and receiving portions because the intermediate rack is in the way of the grip portion that is being vertical moved. Transfer of articles to or from the article delivering and receiving portion is performed by a transfer device 2. The transfer device 2 includes, among other things, a vertical movement mechanism 23 for vertically moving an article, an extendable and retractable mechanism 24 for moving the article in the lateral direction, and a grip mechanism 25 for gripping the article. The transfer device 2 is displaced in the lateral direction from the locations in which the transport carriage 16, the carrying-in port 51a, and the taking-out port 51b are located as seen along the travel direction of the transport carriage 16, and is configured to be able to transfer an article to or from both the intermediate rack and the article delivering and receiving portion by moving the article in the lateral direction with the extendable and retractable mechanism 24.

As an article transport facility that includes an intermediate rack and that is configured such that a ceiling transport vehicle can transfer an article directly to or from an article delivering and receiving portion, a configuration is known in which two ceiling transport vehicles are arranged one above the other in a location displaced in the lateral direction from an article delivering and receiving portion in a plan view and in which an intermediate rack is provided above the travel rail for the lower ceiling transport vehicle. (See, for example, FIG. 4 in Patent Document 2.)

In the article transport facility of Patent Document 2, by arranging the intermediate rack and the two ceiling transport vehicles such that they are in vertical alignment, or overlap vertically, with one another at positions that are displaced in the lateral direction from the article delivering and receiving portion as seen along the travel direction of the ceiling transport vehicle and by providing the ceiling transport vehicle with lateral movement operation means for moving the grip portion in the lateral direction, the upper ceiling transport vehicle can transfer an article to or from the intermediate rack and can also transfer an article directly to or from the article delivering and receiving portion.

PRIOR ART REFERENCES

Patent Documents

Patent Document 1: JP Publication Of Application No. 2005-150129 (FIGS. 3 and 4)
Patent Document 2: JP Publication Of Application No. 2007-331906 (FIG. 4)

SUMMARY OF THE INVENTION

Problems to be Solved by the Invention

In the article transport facility of Patent Document 1 described above, the ceiling transport vehicle cannot transfer an article directly to the article delivering and receiving portion as explained above. And so, it is always necessary for the transfer device 2 to transfer an article when transferring the article to the article delivering and receiving portion; thus articles need to be handed over frequently, which prevents article transport operations to be performed smoothly and is not preferable with regard to the transporting efficiency.

In the article transport facility of Patent Document 2 described above, although the ceiling transport vehicle can transfer an article directly to or from the article delivering and receiving portions, it is necessary to provide the ceiling transport vehicle with the lateral movement operation means for moving the grip portion in the lateral direction, which complicates the configuration of the ceiling transport vehicle.

In addition, in the article transport facility of Patent Document 1 described above, since the transfer device 2 is disposed at a position that is displaced in the lateral direction from the positions at which the ceiling transport vehicle and the article delivering and receiving portion are located as seen along the travel direction of the ceiling transport vehicle, they take up a wide space in the lateral direction. In the article transport facility of Patent Document 2, the upper ceiling transport vehicle and the lower ceiling transport vehicle and the intermediate rack are located such that they are in vertical alignment, or overlap vertically, with one another. And their positions in plan view are displaced in the lateral direction of the ceiling transport vehicle from the position of the article delivering and receiving portion in plan view; thus the upper ceiling transport vehicle and the lower ceiling transport vehicle and the intermediate rack take up a wide space in the lateral direction of the ceiling transport vehicle in the space upward of the article delivering and receiving portion. Thus, in either of the article transport facility of Patent document 1 and the facility of Patent document 2, a wide space, in the space upward of the article delivering and receiving portion, is taken up in the lateral direction of the ceiling transport vehicle, thus requiring a large installation space around the article delivering and receiving portion. This may cause a problem that a space for installing other devices cannot be secured around the article delivering and receiving portion, which is disadvantageous in respect of securing installation space.

In addition, with regard to an efficient use of the space above the article delivering and receiving portion, two ceiling transport vehicles and the article delivering and receiving portion may be located such that they are in vertical alignment, or overlap vertically, with one another as shown in FIG. 2 of Patent Document 2. In this case, although the upper ceiling transport vehicle can temporarily store an article on the intermediate rack (under buffer 26) that is provided above the travel rails of the lower ceiling transport vehicle, the upper ceiling transport vehicle cannot transfer the article directly to the article delivering and receiving portion because the travel rails for the lower ceiling transport vehicle get in the way.

The present invention was made in light of the state of the art described above, and its object is to provide an article transport facility in which articles can be transported smoothly, and that is advantageous in respect of securing an installation space, while avoiding complicating the configuration of the ceiling transport vehicle.

Means for Solving the Problems

In order to attain this object, the first characteristic configuration of the article transport facility in accordance with the present invention is that an article transport facility comprises: a ceiling transport vehicle that is capable of traveling along a travel rail arranged on a ceiling side, that includes a grip portion for supporting an article such that the grip portion can be vertically moved, and that is capable of transferring an article to or from an article delivering and receiving portion provided on a floor side; and an intermediate rack for temporarily storing an article to be transferred to the article delivering and receiving portion, the intermediate rack being located upwardly of the article delivering and receiving portion and downwardly of the ceiling transport vehicle, wherein the intermediate rack is located at a position that is different from the article delivering and receiving portion in a travel direction of the ceiling transport vehicle, wherein the ceiling transport vehicle is configured to be able to transfer an article to or from the article delivering and receiving portion by vertically moving the grip portion with the ceiling transport vehicle stopped at a stop position for the delivering and receiving portion defined at a position that is in vertical alignment with the article delivering and receiving portion, and is configured to be able to transfer an article to or from the intermediate rack by vertically moving the grip portion with the ceiling transport vehicle stopped at a stop position for the intermediate rack defined at a position that is in vertical alignment with the intermediate rack, wherein an intermediate transfer device, that includes a transfer device grip portion for supporting an article such that the transfer device grip portion can be vertically moved, and that is capable of transferring an article to or from the intermediate rack and to or from the article delivering and receiving portion, is provided such that the intermediate transfer device is in vertical alignment with the ceiling transport vehicle and with the article delivering and receiving portion, and is capable of traveling, along the travel direction at a height between the article delivering and receiving portion and the ceiling transport vehicle, to and among: a transfer position for the delivering and receiving portion for transferring an article to or from the article delivering and receiving portion; a transfer position for the intermediate rack for transferring an article to or from the intermediate rack; a transfer-time retracted position for avoiding interfering with the grip portion and an article when the ceiling transport vehicle transfers the article to or from the article delivering and receiving portion; and a temporary-storage-time retracted position for avoiding interfering with the grip portion and an article when the ceiling transport vehicle transfers the article to or from the intermediate rack, wherein a guiding support that supports the intermediate transfer device and that guides a movement of the intermediate transfer device along the travel direction is provided, wherein the guiding support is configured to form a space through which the grip portion and an article can pass in the vertical direction when the ceiling transport vehicle transfers the article while stopped at the stop position for the delivering and receiving portion and at the stop position for the intermediate rack.

With this characteristic configuration, the intermediate rack is located at a position that is different from the article delivering and receiving portion in the travel direction of the ceiling transport vehicle: the stop position for the delivering and receiving portions is set at a position that is in vertical alignment with the article delivering and receiving portion: and, the stop position for the intermediate rack is set at a position that is in vertical alignment with the intermediate rack. Thus, when the ceiling transport vehicle transfers an article to the article delivering and receiving portion or the intermediate rack, the ceiling transport vehicle, the intermediate transfer device, and the article delivering and receiving portion are aligned with one another in the vertical direction as seen along the travel direction of the ceiling transport vehicle. Thus, the position of the ceiling transport vehicle coincides with the position of the article delivering and receiving portion in the lateral direction as seen along the travel direction so that the lateral width of the space taken up by the ceiling transport vehicle and the article delivering and receiving portion can be made compact. Therefore, the space above the article delivering and receiving portion can be utilized efficiently over the entire vertical range, which is advantageous in respect of securing installation space.

In addition, because the intermediate transfer device is configured to be able to move in the travel direction at a height between the article delivering and receiving portion and the ceiling transport vehicle, and because this movement of the intermediate transfer device along the travel direction is guided by the guiding support, the intermediate transfer device as well as the guiding support which guides and supports the intermediate transfer device for movement along the travel direction are located downwardly of the ceiling transport vehicle. When the positional arrangements are such that the intermediate transfer device and guiding support are located downwardly of the ceiling transport vehicle, there is a possibility that the grip portion and the article may interfere with the intermediate transfer device and the guiding support which are located downwardly of the ceiling transport vehicle when the ceiling transport vehicle lowers the grip portion to transfer an article to or from the article delivering and receiving portion. To this end, in the present invention, because the intermediate transfer device can move to the transfer-time retracted position or to the temporary-storage-time retracted position, any interfering of the grip portion of the ceiling transport vehicle and the article with the intermediate transfer device can be prevented when the ceiling transport vehicle transfers the article to or from the article delivering and receiving portion or the intermediate rack, by moving or retracting the intermediate transfer device to the transfer-time retracted position or to the temporary-storage-time retracted position. In addition, since a space, through which the grip portion and an article can pass in the vertical direction when the ceiling transport vehicle transfers the article while stopped at the stop position for the delivering and receiving portion and the stop position for the intermediate rack, is formed in the guiding support which supports the intermediate transfer device and guides its movement along the travel direction, the grip portion and the article do not interfere with the guiding support when vertically moving the grip portion while stopped at the stop position for the delivering and receiving portion set at a position which is in vertical alignment, or overlaps vertically, with the article delivering and receiving portion, or at the stop position for the intermediate rack set at a position which is in vertical alignment, or overlaps vertically, with an intermediate rack. Therefore, the grip portion and the article can be vertically moved so as not to interfere with the intermediate transfer device and the guiding support when vertically moving the grip portion to transfer the article to or from the article delivering and receiving portion or the intermediate rack with the ceiling transport vehicle.

Thus, the ceiling transport vehicle can transfer an article to or from the article delivering and receiving portion by vertically moving the grip portion while stopped at the stop position for the delivering and receiving portion without interfering with the intermediate transfer device and the guiding support, and can transfer an article to or from the intermediate rack by vertically moving the grip portion while stopped at the stop position for the intermediate rack without interfering with the intermediate transfer device and the guiding support. Therefore, it is not necessary to provide, for example, a configuration for projecting the grip portion toward outside of the ceiling transport vehicle in order to locate the grip portion outside the region of presence of the intermediate transfer device which is located at a position below as seen along the travel direction of the ceiling transport vehicle, in order to avoid interfering with the intermediate transfer device and with the guiding support. Thus, interfering with the intermediate transfer device and the guiding support can be avoided with a ceiling transport vehicle of a simple configuration.

In addition, the intermediate transfer device can transfer an article to or from the article delivering and receiving portion by vertically moving the transfer device grip portion while stopped at the transfer position for the delivering and receiving portion, and can transfer an article to or from the intermediate rack by vertically moving the transfer device grip portion while stopped at the transfer position for the intermediate rack. Therefore, after the ceiling transport vehicle has temporarily stored an article on the intermediate rack, the intermediate transfer device can deliver the article to the article delivering and receiving portion. And the intermediate transfer device can receive an article from the article delivering and receiving portion and temporarily store on the intermediate rack in advance, and then the article can be received by the ceiling transport vehicle. Further, the ceiling transport vehicle can transfer an article directly to or from the article delivering and receiving portion. Therefore, article transport operations can be performed smoothly by making full use of the ceiling transport vehicle and the intermediate transfer device and by selecting a suitable transfer configuration depending, among other things, on the operation condition of the ceiling transport vehicles, on whether an article exists in the intermediate rack, or on whether an article exists in the article delivering and receiving portion.

As described above, the present invention can provide an article transport facility in which articles can be transported smoothly, and that is advantageous in respect of securing an installation space, while avoiding complicating the configuration of the ceiling transport vehicle.

The second characteristic configuration of the article transport facility in accordance with the present invention is that the guiding support is formed by a pair of lower guide rails that are spaced apart from each other in a transfer device lateral direction of the intermediate transfer device such that a gap is formed through which the grip portion holding the article can pass in the vertical direction.

With this characteristic configuration, when vertically moving the grip portion in order to transfer an article to or from the article delivering and receiving portions with the ceiling transport vehicle, the grip portion holding an article can pass in the vertical direction through the gap formed between the pair of lower guide rails that are spaced apart from each other in the transfer device lateral direction of the intermediate transfer device. Since the pair of lower guide rails are spaced apart from each other in the transfer device lateral direction, the grip portion of the ceiling transport vehicle can pass in the vertical direction at an arbitrary location of the pair of lower guide rails along the travel direction. And the movement of the intermediate transfer device can be guided with sufficient stability by guiding the movement of the intermediate transfer device in the travel direction with the pair of lower guide rails. Therefore, with a simple configuration, the grip portion can pass advantageously when the ceiling transport vehicle stopped at any stop position while the intermediate transfer device is supported and its movement guided with sufficient stability.

The third characteristic configuration of the article transport facility in accordance with the present invention is that the transfer position for the delivering and receiving portion and the transfer position for the intermediate rack are set so as to be located next to each other in the travel direction, wherein control means for controlling a travel operation of the intermediate transfer device is configured to control the travel operation of the intermediate transfer device such that the intermediate transfer device is caused to stand by at the transfer position for the intermediate rack which serves as the transfer-time retracted position when the ceiling transport vehicle transfers an article to or from the article delivering and receiving portion, and such that the intermediate transfer device is caused to stand by at the transfer position for the delivering and receiving portion which serves as the temporary-storage-time retracted position when the ceiling transport vehicle transfers the article to or from the intermediate rack.

With this characteristic configuration, because the transfer position for the delivering and receiving portion and the transfer position for the intermediate rack are set so as to be located next to each other in the travel direction, the transfer position for the delivering and receiving portion and the transfer position for the intermediate rack are placed close together in the travel direction, no useless space in the travel direction is created between the transfer position for the delivering and receiving portion and the transfer position for the intermediate racks. Therefore, the moving range of the intermediate transfer device in the travel direction can be made as compact as possible.

In addition, the control means can cause the intermediate transfer device to stand by at the transfer position for the intermediate rack which serves as the transfer-time retracted position when the ceiling transport vehicle transfers an article to or from the article delivering and receiving portion, and can cause the intermediate transfer device to stand by at the transfer position for the delivering and receiving portion which serves as the temporary-storage-time retracted position when the ceiling transport vehicle transfers an article to or from the intermediate rack. Thus, the moving range of the intermediate transfer device in the travel direction can be made as compact as possible by using the position that is set up for transfer as a position for retracting without having to separately provide a position for retracting. Therefore, since the distance which the intermediate transfer device has to travel in the travel direction can be made short, which leads to an improved working efficiency for the intermediate transfer device.

The fourth characteristic configuration of the article transport facility in accordance with the present invention is that the intermediate transfer device is configured to be capable of suspending and holding an article by means of the transfer device grip portion wherein the intermediate rack is configured to be capable of receiving and supporting an article such that an upper end of the article supported by the intermediate rack is located below a lower end of an article held by the transfer device grip portion of the intermediate transfer device.

With this characteristic configuration, since the lower end of the article suspended and held by the transfer device grip portion is located higher than the upper end of the article supported by the intermediate rack, the intermediate transfer device holding the article can be moved to the transfer position for the intermediate rack that is supporting the article. Therefore, even if an intermediate rack holds an article when the intermediate transfer device is moved or retracted to the transfer position for the intermediate rack in order to avoid interfering with the transfer operation of the ceiling transport vehicle, the intermediate transfer device that suspends and holds the article with the transfer device grip portion can be retracted to the transfer position for the intermediate rack in question. Thus, the facility is convenient to use since the intermediate transfer device can be retracted to the transfer position for the intermediate rack regardless of whether the intermediate rack holds an article.

The fifth characteristic configuration of the article transport facility in accordance with the present invention is that a plurality of transfer positions for the delivering and receiving portion are set to be located in a row along the travel direction, wherein the intermediate rack is provided at positions that correspond to both one and the other sides of the plurality of transfer positions for the delivering and receiving portion in the travel direction, wherein the transfer position for the intermediate rack is set on both one and the other sides of the plurality of the transfer positions for the delivering and receiving portion in the travel direction, wherein a plurality of stop positions for the delivering and receiving portion are located in a row along the travel direction so as to be in vertical alignment with the plurality of transfer positions for the delivering and receiving portion, and wherein the stop position for the intermediate rack is set on both one and the other sides of the plurality of the stop positions for the delivering and receiving portion in the travel direction.

With this characteristic configuration, since a plurality of transfer positions for the delivering and receiving portion are set to be located in a row along the travel direction, the intermediate transfer device can stop at one of the plurality of transfer positions for the delivering and receiving portion to transfer an article to or from the article delivering and receiving portion. Therefore, the intermediate transfer device has a greater number of opportunities to transfer an article to or from the article delivering and receiving portions, and thus can smoothly perform the transfer operations of articles to or from the article delivering and receiving portion. In addition, the intermediate racks are located spaced apart from each other in the travel direction because the intermediate rack is provided on both one and the other sides of the plurality of transfer positions for the delivering and receiving portion in the travel direction. Therefore, the intermediate transfer device can be swiftly moved to the transfer position for the intermediate rack for one of the intermediate racks regardless of the current position of the intermediate transfer device in the travel direction, which promotes smooth article transport operations making use of the intermediate racks.

Also, since a plurality of stop positions for the delivering and receiving portion are located in a row along the travel direction, the ceiling transport vehicle can stop at one of the plurality of stop positions for the delivering and receiving portion to transfer an article directly to or from the article delivering and receiving portion. Therefore, the ceiling transport vehicle can have a greater number of opportunities to transfer articles directly to or from the article delivering and receiving portion, and thus can smoothly perform the transfer operations of articles to or from the article delivering and receiving portion, further preventing the traffic congestion of the ceiling transport vehicles. In addition, since the intermediate rack is provided at positions that correspond to both one and the other sides of the plurality of transfer positions for the delivering and receiving portion, there are increased opportunities for temporarily storing articles in the intermediate racks when the ceiling transport vehicle cannot transfer an article directly to the article delivering and receiving portion. Conversely, there are also increased opportunities for the ceiling transport vehicle to receive the articles which the intermediate transfer device temporarily stored in the intermediate racks. As such, the ceiling transport vehicle can perform article transfer operations smoothly, making full use of the intermediate racks.

The sixth characteristic configuration of the article transport facility in accordance with the present invention is that a plurality of reserve intermediate racks for supporting articles at positions adjacent to the intermediate rack in a transfer device lateral direction of the intermediate transfer device are provided in a row along a moving direction of the intermediate transfer device, wherein the intermediate transfer, device includes lateral movement operation means for laterally moving the transfer device grip portion in the transfer device lateral direction, and is configured to be capable of transferring an article to the reserve intermediate racks by moving the transfer device grip portion laterally and vertically.

With this characteristic configuration, the transfer device grip portion can be moved or located at the position adjacent to the intermediate rack in the transfer device lateral direction by laterally moving the transfer device grip portion by means of the lateral movement operation means while the intermediate transfer device is stopped. And, in this state, the article can be transferred to a reserve intermediate rack by vertically moving the transfer device grip portion. Therefore, the intermediate transfer device can transfer the article, which the ceiling transport vehicle temporarily stored in the intermediate rack, to a reserve intermediate rack. In addition, the intermediate racks can be kept empty to the extent possible by temporarily storing in a reserve intermediate rack the article that the intermediate transfer device received from the article delivering and receiving portion until the timing comes to deliver the article to the ceiling transport vehicle, so that a ready status can be maintained to the extent possible in which the ceiling transport vehicle can temporarily store an article at any time. Therefore, the ceiling transport vehicle can perform article transfer operations smoothly with the improved buffering capability making full use of the intermediate racks.

The seventh characteristic configuration of the article transport facility in accordance with the present invention is that the article delivering and receiving portion is configured to deliver and receive an article on which an article processing device performs a process, wherein a plurality of the article processing devices are installed in a row along the travel direction of the ceiling transport vehicle, wherein a transfer target group for the article processing device includes the article delivering and receiving portion and the intermediate rack, wherein the transfer target group is provided to each of the plurality of article processing devices, wherein the guiding support is configured to guide a movement of the intermediate transfer device between transfer target groups in the travel direction of the ceiling transport vehicle.

With this characteristic configuration, because the intermediate transfer device can move to and among the transfer target groups for each of the plurality of article processing devices by the guidance of the guiding support, the intermediate transfer device can move to the article delivering and receiving portion and an intermediate rack not only in a certain transfer target group but also in other transfer target groups to transfer an article. Therefore, articles can be transferred to all the article delivering and receiving portions and intermediate racks in the plurality of transfer target groups by providing only a smaller number of intermediate transfer devices than the number of the transfer target groups without having to provide a separate intermediate transfer device to each of the plurality of transfer target groups. Thus, it is possible to reduce the number of intermediate transfer devices to be installed when a plurality of the transfer target groups are provided.

In addition, since the intermediate transfer device can move between the transfer target groups for each of the plurality of article processing devices, when an article on which a processing by a certain article processing device has been completed is transported to a transfer target group of another article processing device, for example, the article to be transported can be transported by the intermediate transfer device instead of transporting the article in question with the ceiling transport vehicle. This can reduce the transporting load of a ceiling transport vehicle.

The eighth characteristic configuration of the article transport facility in accordance with the present invention is that the article delivering and receiving portion is configured to deliver and receive an article on which an article processing device performs a process, wherein a plurality of the article processing devices are installed in a row along the travel direction of the ceiling transport vehicle, wherein a transfer target group for the article processing device includes the article delivering and receiving portion and the intermediate rack, wherein the transfer target group is provided to each of the plurality of article processing devices, wherein the intermediate transfer device is provided to each of the plurality of transfer target groups such that the intermediate transfer device is assigned to transfer articles to each of the transfer target groups for the plurality of article processing devices, and wherein the guiding support is configured to guide movements of the intermediate transfer devices such that each of the intermediate transfer devices can move between the transfer target group which the intermediate transfer device is assigned to and the transfer target group which another intermediate transfer device is assigned to.

With this characteristic configuration, since an intermediate transfer device, that is assigned to transfer articles to the article delivering and receiving portion and intermediate racks in a transfer target group in question, is provided to each transfer target group, the intermediate transfer device assigned to each transfer target group can perform transfer of articles in each transfer target group. Further, because the guiding support is configured to guide movements of the intermediate transfer devices such that each of the intermediate transfer devices can move between the transfer target group which the intermediate transfer device is assigned to and the transfer target group which another intermediate transfer device is assigned to, the intermediate transfer device can move to other transfer target groups other than the transfer target group to which it is assigned. Accordingly, by moving a plurality of intermediate transfer devices to the transfer target group with a higher transfer demand among the plurality of transfer target groups in order to focus the article transfer operations on the article delivering and receiving portion and the intermediate racks in the transfer target group in question with the plurality of intermediate transfer devices, article transfer to the article delivering and receiving portion and the intermediate racks in a transfer target group with higher transfer demand can be performed swiftly.

Further, since the intermediate transfer device can move from the transfer target group of the article processing device which it is assigned to to the transfer target groups of other article processing devices, when an article on which a processing by a certain article processing device has been completed is transported to a transfer target group of another article processing device, for example, the article can be transported to the transfer target group of another article processing device by the intermediate transfer device that is assigned to the transfer target group of the article processing device which completed the processing instead of transporting the article in question with the ceiling transport vehicle. This can reduce the transporting load of a ceiling transport vehicle.

DESCRIPTION OF THE PREFERRED EMBODIMENTS

First Embodiment

Figure 1:
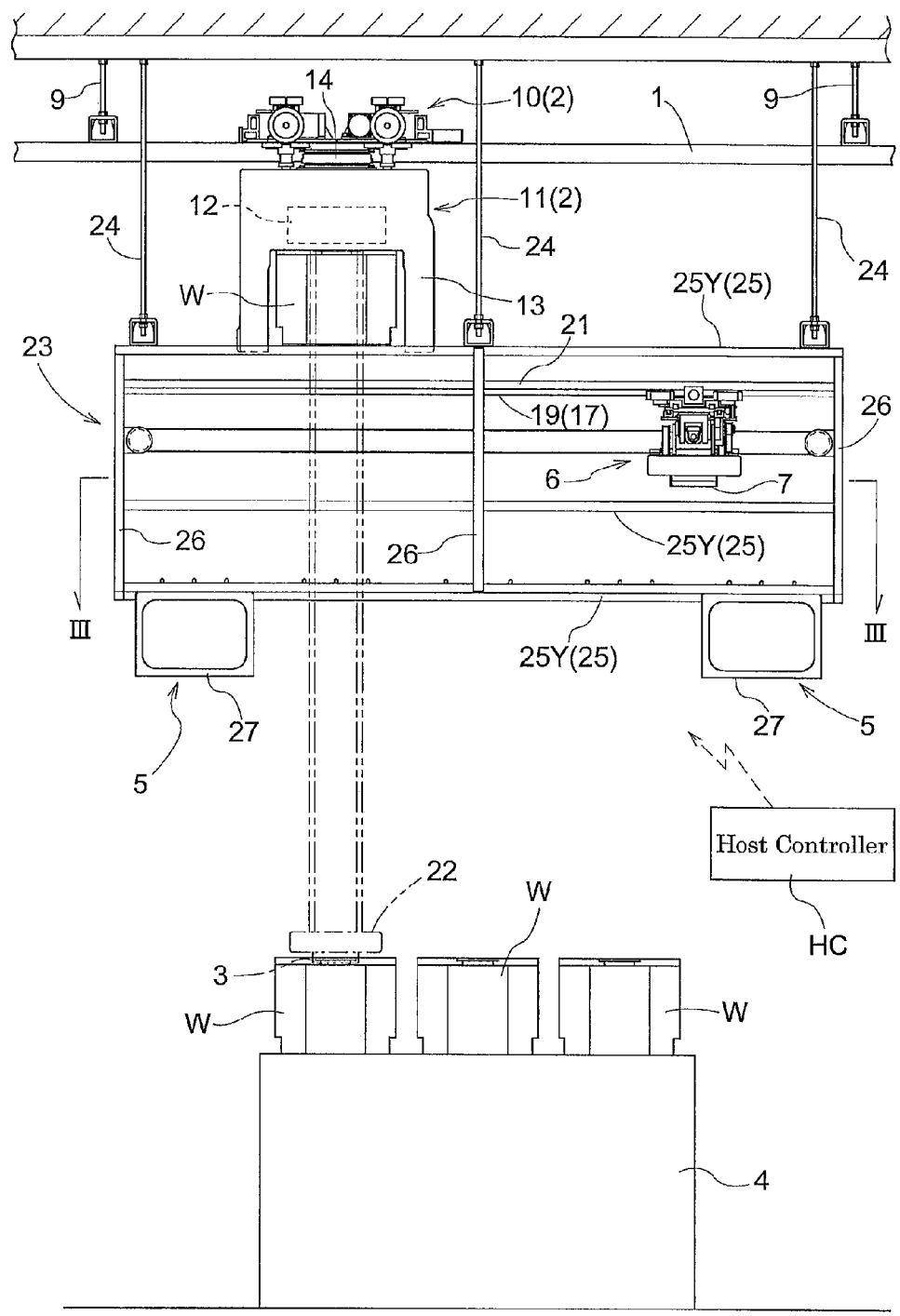
FIG. 1 is a side view of an article transport facility in accordance with the first embodiment of the present invention.
Figure 2:
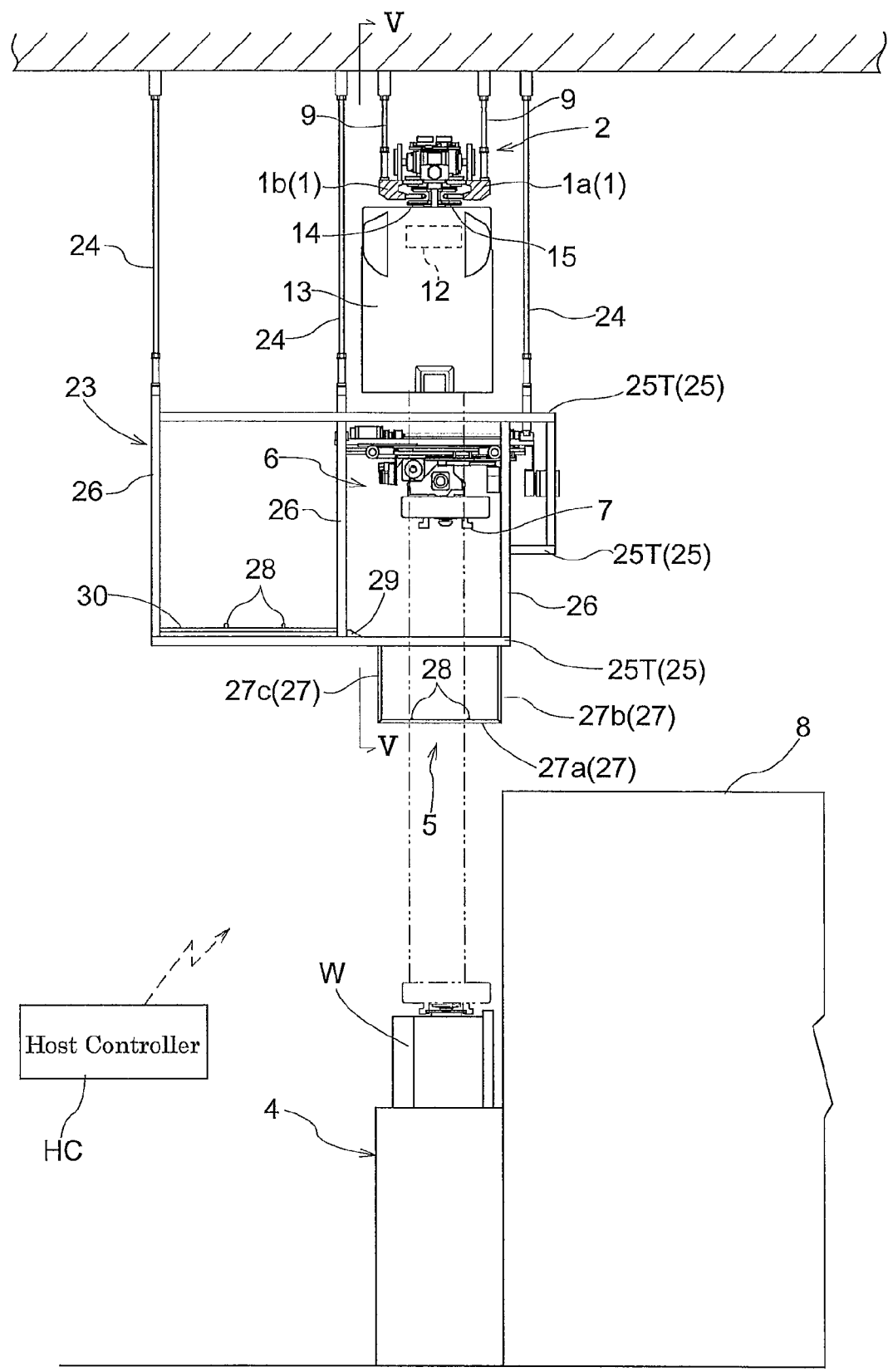
FIG. 2 is a front view of the article transport facility in accordance with the first embodiment of the present invention.

The first embodiment of the article transport facility in accordance with the present invention is described with reference to the drawings. As shown in FIGS. 1 and 2, the article transport facility includes one or more ceiling transport vehicle or vehicles 2 that can travel along a travel rail 1 disposed on the ceiling side. The ceiling transport vehicle 2 includes a grip portion 3 for supporting an article W such that the grip portion can be raised and lowered or moved vertically, and is configured to be able to transfer an article W to or from a station 4 by vertically moving the grip portion 3 with the ceiling transport vehicle 2 stopped at a stop position Q1 (see Q1a, Q1b, or, Q1c in FIG. 4) for the delivering and receiving portion, set at a position which is in vertical alignment, or overlaps in the vertical direction, with the station 4, which functions as an article delivering and receiving portion provided on the floor side. While the travel rail 1 includes straight sections and curved sections (not shown), as shown in FIGS. 1 and 2, the section located in front of and behind the stop positions Q1 for the delivering and receiving portion of the station 4 in the travel direction of the ceiling transport vehicle 2 (referred to, hereinafter, simply as the travel direction), is a straight section.

Intermediate racks 5 for temporarily storing articles W to be transferred to the station 4 is provided upwardly of, or above, the station 4 and downwardly of, or below, the travel path of the ceiling transport vehicle 2 such that the intermediate rack 5 is in vertical alignment, or overlaps vertically, with the ceiling transport vehicle 2 that transfers the article W to the station 4 and with the station 4 as seen in the travel direction. Two intermediate racks 5 are provided at the same height such that they are spaced apart from each other in the travel direction. The two intermediate racks 5 are located directly above the station 4 as seen along the travel direction of the ceiling transport vehicle 2 and are located at positions that are different from the station 4 in the travel direction of the ceiling transport vehicle 2 in plan view.

An intermediate transfer device 6 which can move along, or parallel to, the travel direction of the ceiling transport vehicle 2 is provided upwardly of the intermediate racks 5 and downwardly of the travel path of the ceiling transport vehicle 2 such that the intermediate transfer device 6 is in vertical alignment, or overlaps in the vertical direction, with the ceiling transport vehicle 2 and the station 4 as seen along the travel direction. The intermediate transfer device 6 includes a transfer device grip portion 7 for suspending and holding an article W such that the transfer device grip portion 7 can be moved vertically or raised and lowered. And the intermediate transfer device 6 is configured to be able to transfer an article W to or from the intermediate racks 5 and to or from the station 4.

The station 4 is provided at an end portion of an article processing device 8 (see FIG. 2) which performs work, such as performing a process or inspection, on articles W, such that the station 4 can receive and support one or more article or articles W at a height lower than the height of the article processing device 8. An article W delivered to the station 4 by the ceiling transport vehicle 2 or the intermediate transfer device 6 is taken into the interior of the article processing device 8. And the article W on which the processing has been completed is again brought out to the station 4, and is received by the ceiling transport vehicle 2 or the intermediate transfer device 6. In the present embodiment, an article transport facility is used as an example in which the ceiling transport vehicle 2 transports, as articles W, substrate containers for holding or storing semiconductor substrates. And the article processing device 8 performs work, such as, performing a process or an inspection, on the semiconductor substrates stored in the substrate containers.

Figure 4:
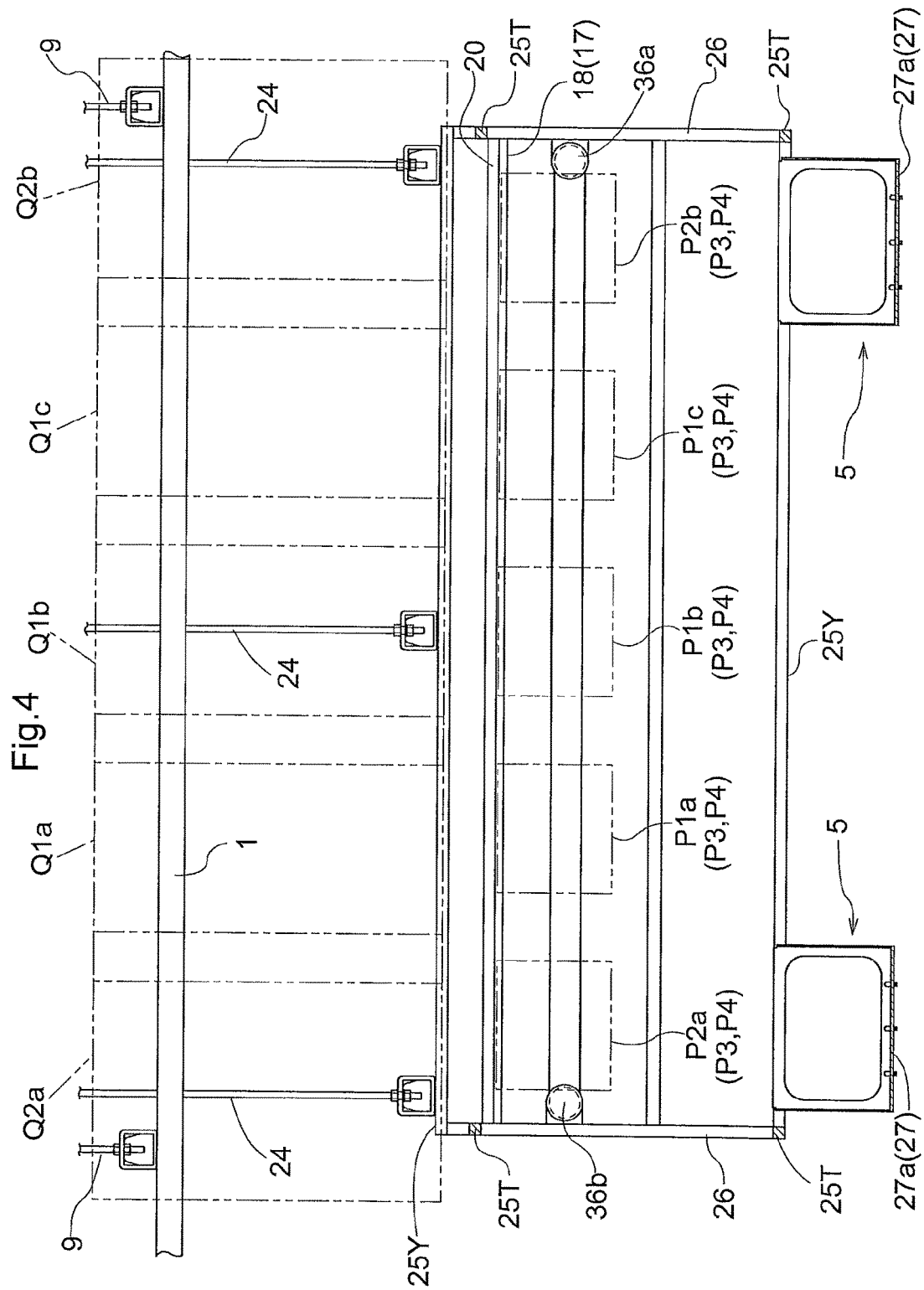
FIG. 4 is a side view showing a stop position of a ceiling transport vehicle and a transfer position of an intermediate transfer device in accordance with the first embodiment of the present invention.

In the present embodiment, the length of the station 4 in the travel direction is set such that the station 4 can receive and support three articles W arranged or lined up next to each other in a row in the travel direction. That is, three article delivering and receiving positions are defined on the station 4. And as shown in FIG. 4, three stop positions for the delivering and receiving portion, namely, in the order from upstream to downstream in the travel direction of the ceiling transport vehicle 2, a first stop position Q1a for the delivering and receiving portion, a second stop position Q1b for the delivering and receiving portion, and a third stop position Q1c for the delivering and receiving portion, are defined as the stop positions Q1 for the delivering and receiving portion at which the ceiling transport vehicle 2 stops when the ceiling transport vehicle 2 transfers an article W to or from these article delivering and receiving positions, such that each stop position corresponds to each of the three article delivering and receiving positions.

The travel rail 1 includes a pair of rail members 1a, 1b that are spaced apart from each other in the lateral direction which intersects perpendicularly and horizontally with the travel direction. The pair of rail members 1a, 1b are suspended and supported by a pair of rail support members 9 provided to the ceiling.

The ceiling transport vehicle 2 includes a travel portion 10 which has a travel motor 51 (see FIG. 9) and travels on the travel rail 1, and a main body portion 11 which is suspended and supported by the travel portion 10 and which supports an article W such that the article W can be vertically moved and turned or rotated. Connecting members for connecting the travel portion 10 and the main body portion 11 to each other are provided such that they are located between the pair of rail members 1a, 1b. The main body portion 11 includes a grip portion 3 for holding an article W, vertical movement operation means 12 for vertically moving a vertical movement support body 22 which supports the grip portion 3, turning operation means (not shown) for turning or rotating the grip portion 3 together with the vertical movement support body 22 about a vertical axis, and a cover body 13 which covers the article W held by the grip portion 3, from above, front, back, and from one of the right side and left side. In addition, the main body portion 11 includes a power receiving coil 14 such that the coil 14 is located between the pair of rail members 1a, 1b. And magnetic field is generated by applying alternating currents in electricity supply lines 15 arranged along the travel rail 1. The magnetic field causes the power receiving coil 14 to generate electric power required by the ceiling transport vehicle 2 so that electric power is supplied to the ceiling transport vehicle 2 without contact or contactlessly.

The vertical movement operation means 12 includes a vertical movement motor 52 (see FIG. 9) and a rotating drum, and is configured to vertically move, or raise and lower, the vertical movement support body 22 by virtue of the fact that the rotating drum is driven and rotated in forward and reverse directions by the rotation of the vertical movement motor 52 to spool and feed out spooling belts 16. The turning operation means includes a turning motor 53 (see FIG. 9) so that the vertical movement support body 22 is turned or rotated about a vertical axis by the rotation of this turning motor 53. The vertical movement support body 22 supports a switching mechanism for switching the attitude of the grip portion 3 between a gripping attitude for gripping the article W and a grip release attitude in which the grip is released by the operation of a gripper motor 54 (see FIG. 9).

And while stopped at a stop position Q1 for the delivering and receiving portion, the ceiling transport vehicle 2 is configured to be able to transfer an article W to the station 4 by vertically moving the vertical movement support body 22 with the vertical movement operation means 12, by turning the vertical movement support body 22 with the turning operation means, and by switching the grip portion 3 between the gripping attitude and the grip release attitude with the switching mechanism.

As shown in FIGS. 1 and 2, the intermediate racks 5 are provided such that each projects downwardly from a lower portion of the buffer frame 23 which is suspended and supported from and by the ceiling. The buffer frame 23 is suspended and supported by nine rack suspensions 24 which are provided to the ceiling such that, at each of three locations located in a row along the travel direction, three rack suspensions 24 are located to be separated from each other in the lateral direction by a distance greater than the lateral width of the travel path of the ceiling transport vehicle 2. The rack suspensions 24 are longer than the rail support members 9 for suspending and supporting the travel rail 1 by a length that corresponds to the vertical height of the ceiling transport vehicle 2. Thus, as shown in FIG. 2, the buffer frame 23 is located downwardly of the travel path of the ceiling transport vehicle 2 with the travel path of the ceiling transport vehicle 2 located between a pair of rack suspensions 24 as seen along the travel direction.

Figure 3:
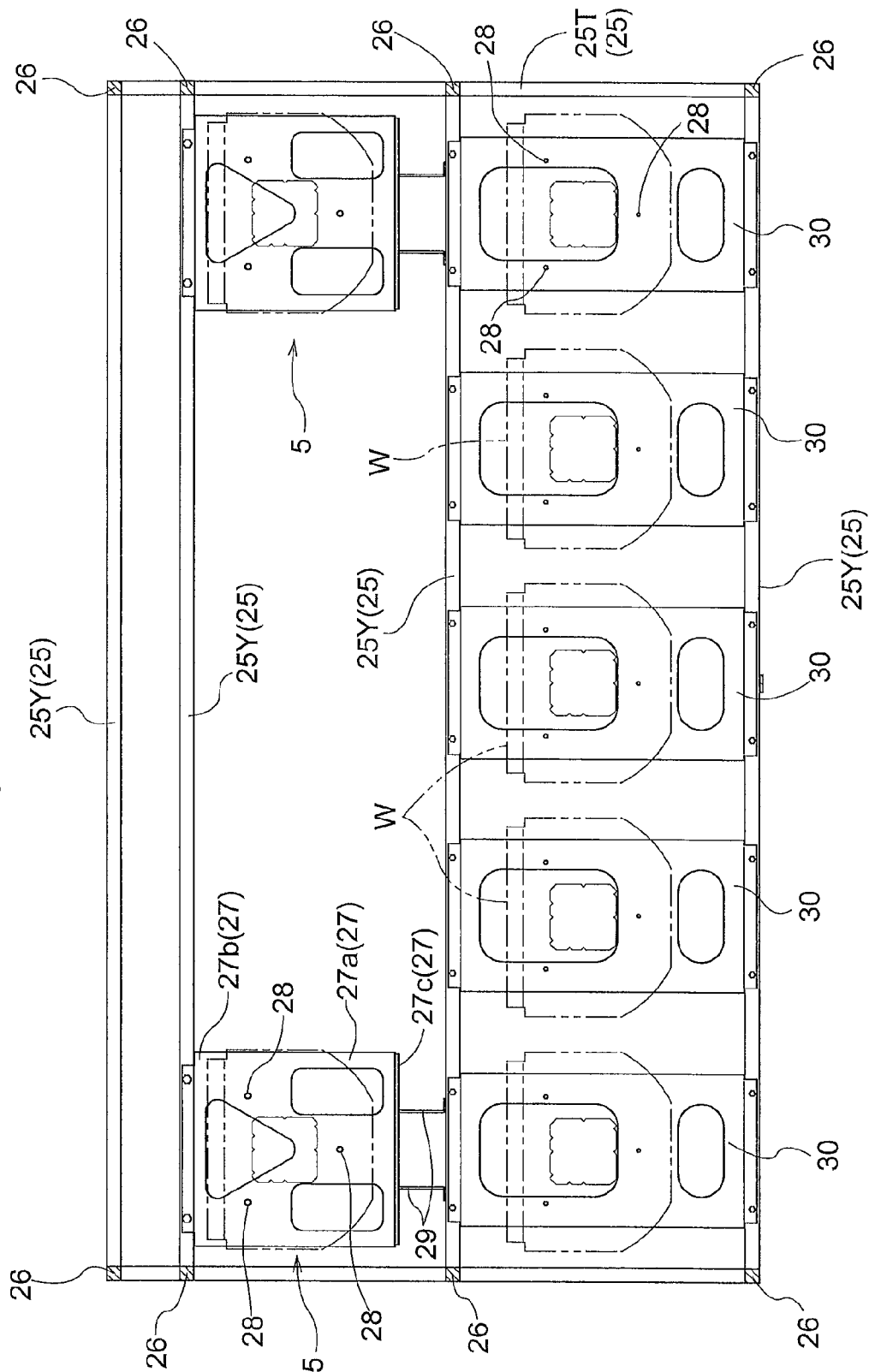
FIG. 3 is a plan view as seen along the arrows III-III in FIG. 1.

As shown also in FIG. 3, the buffer frame 23 is a framework constructed with, among other things, a plurality of horizontal members 25 including lateral horizontal members 25Y extending in the travel direction and perpendicular horizontal members 25T extending in the lateral direction, and with a plurality of vertical members 26 extending along the vertical direction. Among the horizontal members 25 located in the lower portion of the buffer frame 23, a pair of lateral horizontal members 25Y that are located on both sides and outwardly of the travel path of the ceiling transport vehicle 2 in plan view are provided with an intermediate rack member 27 which defines the intermediate rack 5, at each of the one and the other end locations in the travel direction.

Figure 8:
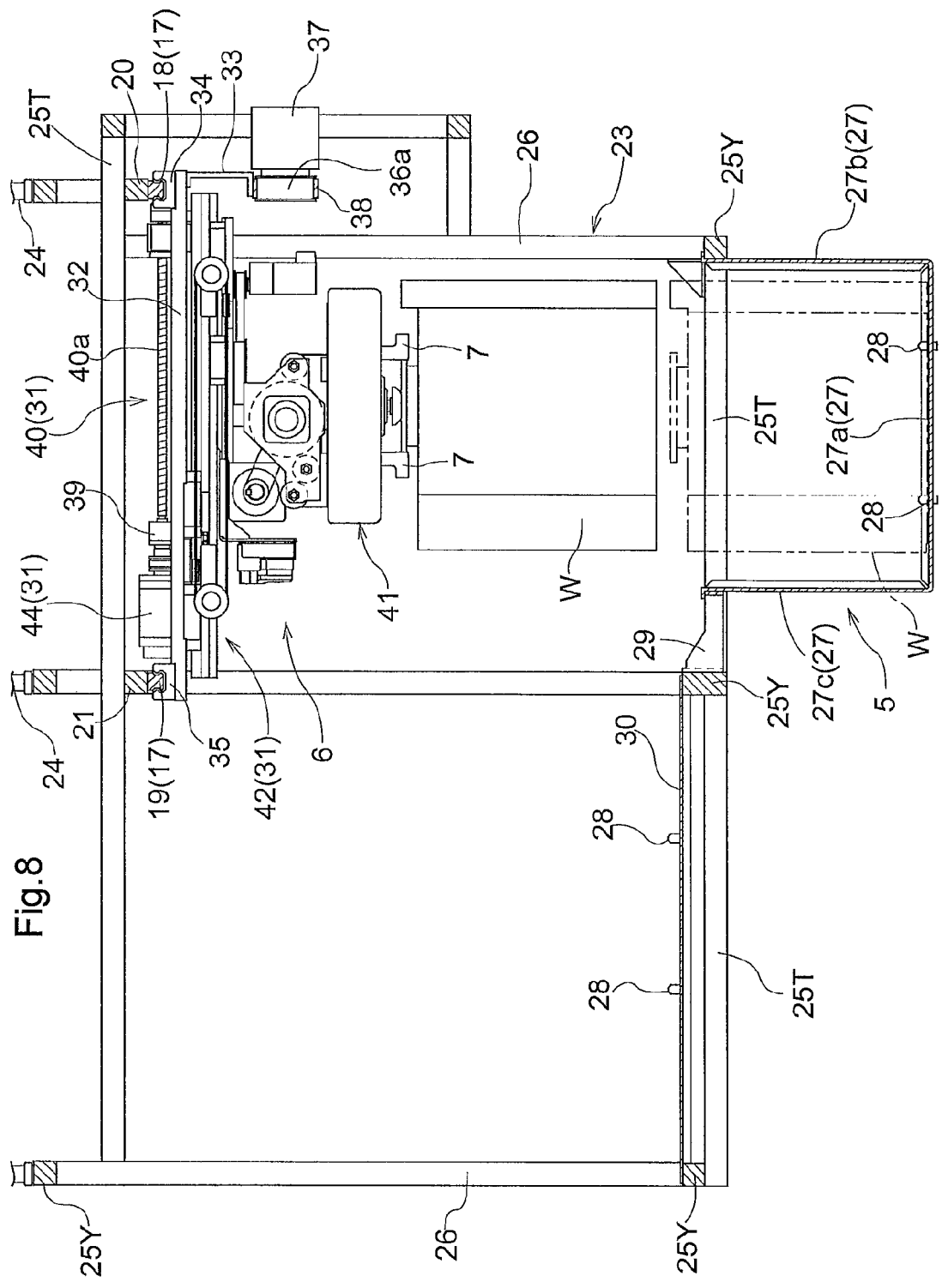
FIG. 8 is a vertical sectional front view showing a transfer operation to or from an intermediate rack by the intermediate transfer device in accordance with the first embodiment of the present invention.

As shown in FIG. 3, the intermediate rack members 27 includes a horizontally oriented support surface portion 27a having three positioning pins 28 for engaging three positioning engaging grooves formed in the bottom surface of the article W to position the article W, a connecting plate portion 27b extending upwardly from one end of the support surface portion 27a, and a connecting plate portion 27c extending upwardly from the other end of the support surface portion 27a. The intermediate rack member 27 is fixed to the buffer frame 23 (see FIG. 8) such that its support surface portion 27a is located below or downwardly of the lower end of the buffer frame 23 by an amount or distance that corresponds to the height of the article W by virtue of the fact that the upper end of the connecting plate portion 27b on one side is connected to a lateral horizontal member 25Y, and the fact that the upper end of the connecting plate portion 27c on the other side is connected, by a connecting bracket 29, to another lateral horizontal member 25Y that is located adjacent to the lateral horizontal member 25Y on the one side in the lateral direction. The expression "an amount or distance that corresponds to the height of the article W" may be a value that is equal to the height of the article W, or may be a value that is obtained by adjusting the height of the article W. As shown in FIG. 8, the support surface portion 27a is located below or downwardly of the lower end of the buffer frame 23 by a height that is slightly less than the height of the article W in the present example. With such a configuration, the article W is received and supported by the support surface portion 27a with the article W in an attitude in which its front face (surface in which the front opening of the substrate container is located) faces or is oriented toward the connecting plate portion 27b on the one side (i.e. attitude in which the front face is oriented toward left in FIG. 3).

Figure 6:
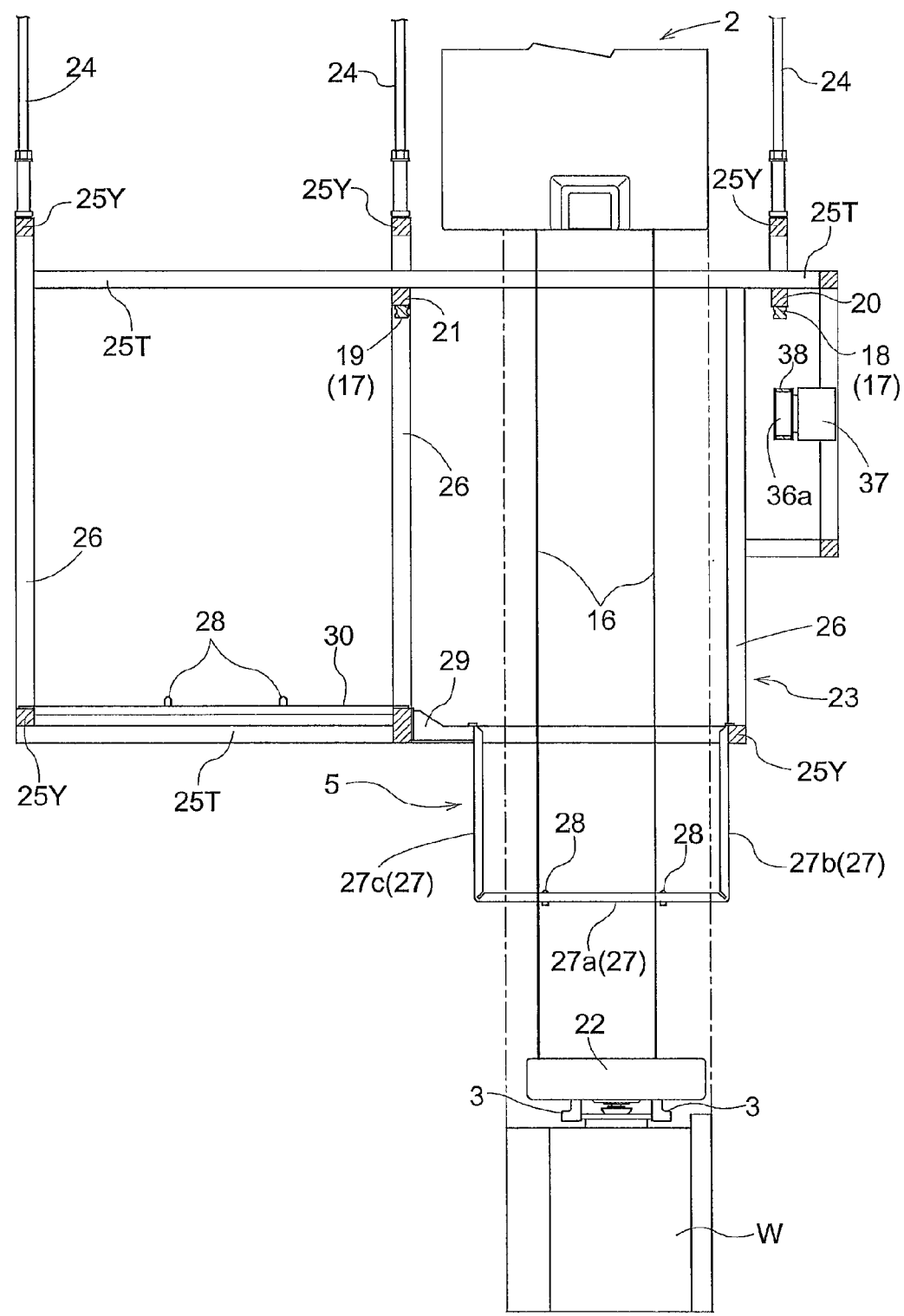
FIG. 6 is a vertical sectional front view showing a transfer operation to or from an article delivering and receiving portion by the ceiling transport vehicle in accordance with the first embodiment of the present invention.

As shown in FIG. 3, an opening for performing transfers to or from the three article transfer locations in the station 4 is defined or formed by the pair of intermediate rack members 27 and the pair of lateral horizontal members 25Y to which these intermediate rack members 27 are connected (hereinafter, referred to as lateral horizontal members 25Y for supporting the intermediate racks). This allows the ceiling transport vehicle 2 to transfer an article W to or from the station 4 by vertically moving the grip portion 3 while stopped at one of the three stop positions Q1 (see FIG. 4) for the delivering and receiving portion, as shown in FIGS. 1 and 6. In addition, as shown in FIG. 4, a first stop position Q2a for the intermediate rack and a second stop position Q2b for the intermediate rack are defined or provided, in the order from upstream to downstream in the travel direction of the ceiling transport vehicle 2, as the stop positions Q2 for the intermediate racks at which the ceiling transport vehicle 2 stops when transferring an article W to or from the intermediate racks 5. And with the ceiling transport vehicle 2 stopped at either of the two stop positions Q2 for the intermediate racks that are defined or set at the positions that are in vertical alignment, or overlap in the vertical direction, with the pair of intermediate racks 5, the ceiling transport vehicle 2 is configured to be able to transfer an article W to or from the intermediate rack 5 located directly below the stop position by vertically moving the grip portion 3.

Figure 5:
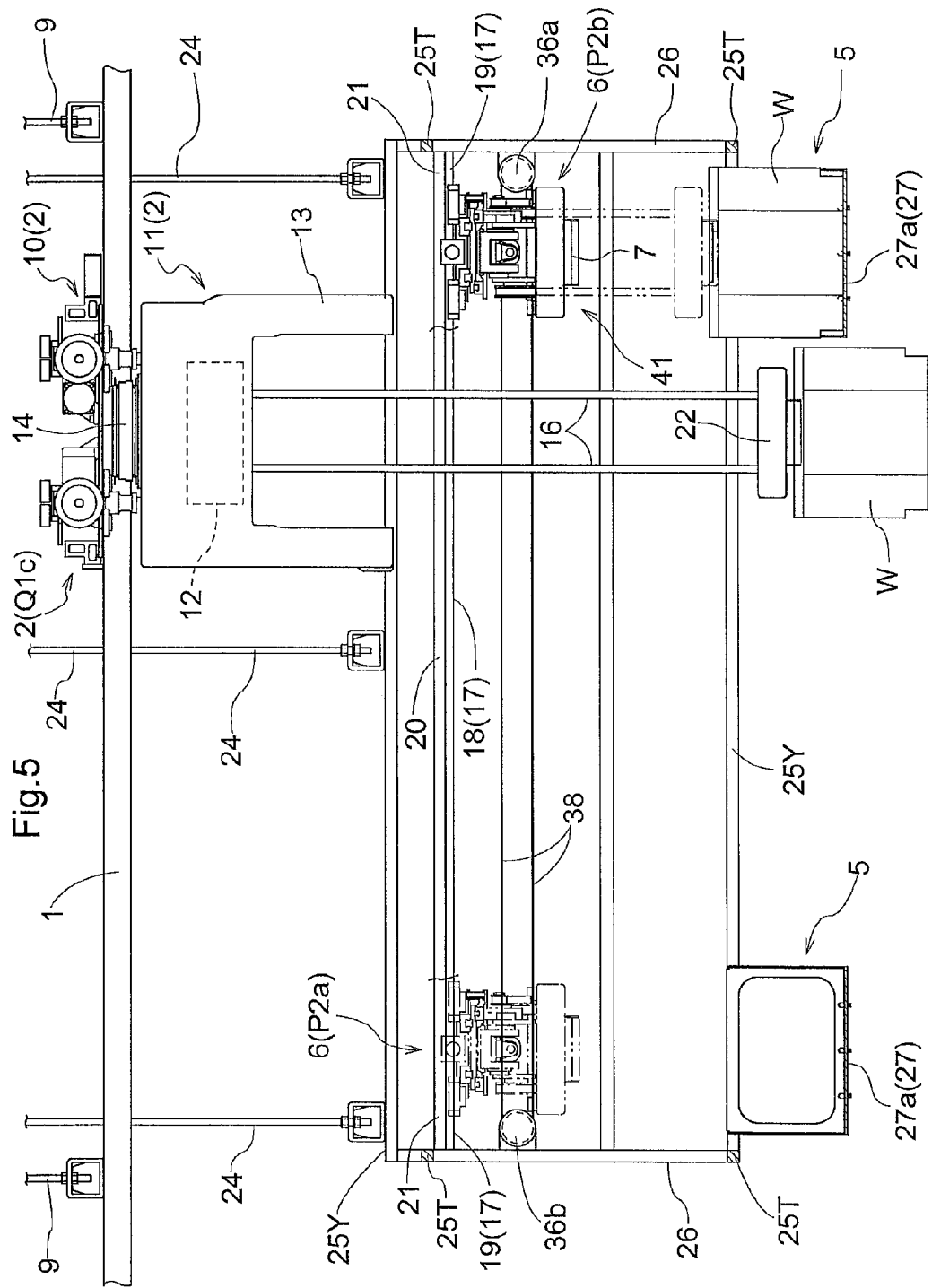
FIG. 5 is a side view as seen along the arrows V-V in FIG. 2.

The intermediate transfer device 6 is also configured to be able to transfer an article W to or from the station 4 by vertically moving the transfer device grip portion 7 while stopped at a transfer position P1 (see FIG. 4) for the delivering and receiving portion for transferring articles W to or from the station 4, and to, as shown in FIGS. 5 and 8, transfer an article W to or from the intermediate rack 5 located directly below the transfer position by vertically moving the transfer device grip portion 7 while stopped at a transfer position P2 for the intermediate rack that is defined or set at the position that is in vertical alignment, or overlaps in the vertical direction, with a intermediate rack 5. Similar to the three stop positions Q1 for the delivering and receiving portion for the ceiling transport vehicle 2, three transfer positions P1 for the delivering and receiving portion for the intermediate transfer device 6, namely, a first transfer position P1a for the delivering and receiving portion, a second transfer position P1b for the delivering and receiving portion, and a third transfer position P1c for the delivering and receiving portion are defined or set such that each corresponds to each of the three article delivering and receiving positions in the station 4. Similar to the two stop positions Q2 for the intermediate racks for the ceiling transport vehicle 2, two transfer positions P2 for the intermediate racks for the intermediate transfer device 6 namely a first transfer position P2a for the intermediate rack and a second transfer position P2b for the intermediate rack are also defined or set such that each corresponds to each of the pair of intermediate racks 5.

As such, a plurality of transfer positions P1 for the delivering and receiving portion are defined or set such that they are arranged in a row along the travel direction. And the intermediate rack 5 is provided on each of both one and the other sides, in the travel direction, of the plurality of transfer positions P1 for the delivering and receiving portion (first transfer position P1a for the delivering and receiving portion, the second transfer position P1b for the delivering and receiving portion, and the third transfer position P1c for the delivering and receiving portion). And a transfer position P2 for the intermediate rack is defined or set on both one and the other sides, in the travel direction, of the plurality of transfer positions P1 for the delivering and receiving portion (see FIG. 4).

As shown in FIGS. 2, 3, and 4, a plurality of reserve intermediate racks 30 are provided in a row along the travel direction and between the lateral horizontal member 25Y to which the connecting bracket 29 is connected and the lateral horizontal member 25Y located on the opposite side, with respect to the lateral horizontal member 25Y to which the connecting bracket 29 is connected, from the lateral horizontal member 25Y to which the upper end of the connecting plate portion 27b is connected (i.e. the lateral horizontal member 25Y located at the right end in FIG. 3). Each of the reserve intermediate racks 30 has three positioning pins 28, similar to those on the support surface portion 27a in the intermediate rack member 27, so that an article W is received and supported by the reserve intermediate rack 30 with the article W in the same attitude as an article W received and supported by the support surface portion 27a in which the front surface of the article W faces or is oriented toward the connecting plate portion 27b.

While described below in more detail, the intermediate transfer device 6 which can move directly below the travel path of the ceiling transport vehicle 2 and along the travel direction includes lateral movement operation means 31 for laterally moving, in a transfer device lateral direction, the transfer device grip portion 7 which can be vertically moved. And while stopped at one of transfer stop positions which are defined or set in advance for each of the reserve intermediate racks 30, the intermediate transfer device 6 is configured to transfer an article W to or from the reserve intermediate rack 30 by moving the transfer device grip portion 7 laterally and vertically. Thus, the plurality of reserve intermediate racks 30 for supporting articles W are provided in a row along the moving direction of the intermediate transfer device 6 at positions next to the intermediate racks 5 in the transfer device lateral direction of the intermediate transfer device 6. And the intermediate transfer device 6 includes the lateral movement operation means 31 for laterally moving the transfer device grip portion 7 in the transfer device lateral direction, and is configured to transfer an article W to or from the reserve intermediate racks 30 by moving the transfer device grip portion 7 laterally and vertically. Incidentally, in the present embodiment, since the position of a reserve intermediate rack 30 in the travel direction in plan view coincides with the position, in the travel direction in plan view, of an intermediate rack 5, or an article delivering and receiving position of the station 4, that is located next to the reserve intermediate rack 30 in question in the lateral direction, the transfer stop position for the intermediate transfer device 6 for each reserve intermediate rack 30 coincides, in plan view, with the transfer stop position for the intermediate rack 5 or the article delivering and receiving position of the station 4, that is located next to the reserve intermediate rack 30 in question in the lateral direction. In other words, each of the plurality of transfer positions P1 for the delivering and receiving portion (i.e., the first transfer position P1a for the delivering and receiving portion, the second transfer position P1b for the delivering and receiving portion, and the third transfer position P1c for the delivering and receiving portion), and of the plurality of transfer positions P2 for the intermediate racks (the first transfer position P2a for the intermediate rack and the second transfer position P2b for the intermediate rack) is a transfer stop position for each reserve intermediate rack 30.

As described above, the intermediate transfer device 6 is capable of moving to the three transfer positions, which are the transfer positions P1 for the delivering and receiving portion, namely, the first transfer position P1a for the delivering and receiving portion, the second transfer position P1b for the delivering and receiving portion, and the third transfer position P1c for the delivering and receiving portion, as well as to the two transfer positions, which are the transfer positions P2 for the intermediate racks, namely, the first transfer position P2a for the intermediate rack, and the second transfer position P2b for the intermediate rack. And the intermediate transfer device 6 transfers to or from the station 4 or to or from the intermediate rack 5 while stopped at one of these transfer positions. The travel operation and the transfer operation of the intermediate transfer device 6 are described next.

The intermediate transfer device 6 is configured to be able to move or travel at a height between the station 4 and the ceiling transport vehicle 2 and along the travel direction, to and among the transfer positions P1 for the delivering and receiving portion for transferring articles W to or from the station 4, the transfer positions P2 for the intermediate racks for transferring articles W to or from the intermediate racks 5, transfer-time retracted positions P3 for avoiding interfering with the grip portion 3 and the article W when the ceiling transport vehicle 2 transfers an article W to or from the station 4, and temporary-storage-time retracted positions P4 for avoiding interfering with the grip portion 3 and the article W when the ceiling transport vehicle 2 transfers an article W to or from an intermediate rack 5.

The buffer frame 23 includes a guiding support 17 which supports the intermediate transfer device 6 and guides its movement along the travel direction. This guiding support 17 is configured to form a space through which the grip portion 3 and the article W can pass in the vertical direction when the ceiling transport vehicle 2, that is stopped at a stop position Q1 for the delivering and receiving portion or at a stop position Q2 for the intermediate rack, transfers an article W. More specifically, the guiding support 17 consists of a pair of lower guide rails 18, 19 that are so located to be spaced apart from each other in the transfer device lateral direction of the intermediate transfer device 6 such that the rails 18, 19 form the gap through which the grip portion 3 holding an article W can pass in the vertical direction.

As shown in FIGS. 2, 5, 7, and 8, the pair of lower guide rails 18, 19 are attached to the undersurfaces of two rail mounting members 20, 21 which connect a pair of perpendicular horizontal members 25T located at both ends in the travel direction in an upper portion of the buffer frame 23. Slide blocks 34, 35, which engage the pair of lower guide rails 18, 19 for sliding motion relative thereto, are fixedly provided to both end portions, in the transfer device lateral direction, of a movement base 32 provided in an upper portion of the intermediate transfer device 6. An operated bracket 33 is attached to one end side of the movement base 32 as seen along the travel direction. The operated bracket 33 includes a horizontal portion 33a which is formed by bending its lower end portion. And the horizontal portion 33a of the operated bracket 33 is connected to the top surface of the upper-side circulating portion of a moving operation timing belt 38 which has a vertically-oriented circulating plane and which is run over a toothed drive pulley 36a and a driven pulley 36b which have laterally extending axes.

And the movement base 32 can be moved in straight and reciprocating motion along the pair of lower guide rails 18, 19 by causing the moving operation motor 37 for circulating the moving operation timing belt 38 to rotate and drive in a forward and reverse direction. In other words, the travel operation of the intermediate transfer device 6 along the travel direction can be controlled by controlling the rotation of the moving operation motor 37. In addition, the positioning control for the travel operation of the intermediate transfer device 6 along the travel direction may be performed by a servo control, i.e. by using a servo motor as the moving operation motor 37. Alternatively, a plurality of photoelectric sensors, that function as position detection means for detecting the position of the intermediate transfer device 6 in the travel path along the travel direction, may be provided at locations that correspond to each of the first transfer position P1a for the delivering and receiving portion for the intermediate transfer device 6, the second transfer position P1b for the delivering and receiving portion, the third transfer position P1c for the delivering and receiving portion, the first transfer position P2a for the intermediate rack, and the second transfer position P2ba for the intermediate rack. And the positioning control may be performed based on the detected information from these sensors.

In the present embodiment, the transfer positions P1 for the delivering and receiving portion and the transfer positions P2 for the intermediate racks are defined or set to be next to each other in the travel direction so that the intermediate transfer device 6 can move efficiently along the pair of lower guide rails 18, 19. As described above, the intermediate rack members 27 which form the intermediate rack 5 are fixed to the buffer frame 23 such that the support surface portion 27a is located below or downwardly of the buffer frame 23 by an amount or distance that corresponds to the height of the article W. And the intermediate rack 5 is configured to be able to support an article W such that the upper end of the article W supported is located downwardly of the lower end of an article W held by the transfer device grip portion 7 of the intermediate transfer device 6. This allows the intermediate transfer device 6 holding the article to move to the transfer position P2 for the intermediate rack for the intermediate rack 5 in question even if an article W is temporarily stored on the intermediate rack 5. Therefore, the transfer positions P2 for the intermediate racks can be used as the transfer-time retracted positions P3.

In the present embodiment, when the ceiling transport vehicle 2 transfers an article W to or from the station 4 while stopped at one of the three stop positions Q1 for the delivering and receiving portion, one of the first transfer position P2a for the intermediate rack, the second transfer position P2b for the intermediate rack, and the transfer positions P1 for the delivering and receiving portion (i.e. two positions among the three) at locations different from the stop position Q1 for the delivering and receiving portion at which the ceiling transport vehicle 2 in question is stopped in the travel direction, is selected as a transfer position for moving out of the way or retracting. Therefore, both the transfer positions P1 for the delivering and receiving portion and the transfer positions P2 for the intermediate racks, can function as the transfer-time retracted positions P3 (see FIG. 4) in the present embodiment.

In addition, when the ceiling transport vehicle 2 transfers an article W to or from an intermediate rack 5 while stopped at either of the two stop positions Q2 for the intermediate racks, one of the first transfer position P1a for the delivering and receiving portion, the second transfer position P1b for the delivering and receiving portion, the third transfer position P1c for the delivering and receiving portion, a transfer position P2 for the intermediate rack (i.e. one of the two transfer positions) at a location different from the stop position Q2 for the intermediate rack at which the ceiling transport vehicle 2 in question is stopped in the travel direction, is selected as a transfer position for moving out of the way or retracting. Therefore, in the present embodiment, both the transfer positions P1 for the delivering and receiving portion and the transfer positions P2 for the intermediate racks can function as the temporary-storage-time retracted positions P4 (see FIG. 4). As such, in the present embodiment, both the transfer positions P1 for the delivering and receiving portion and the transfer positions P2 for the intermediate racks can function either as the temporary-storage-time retracted positions P4 or as transfer-time retracted positions P3.

Figure 7:
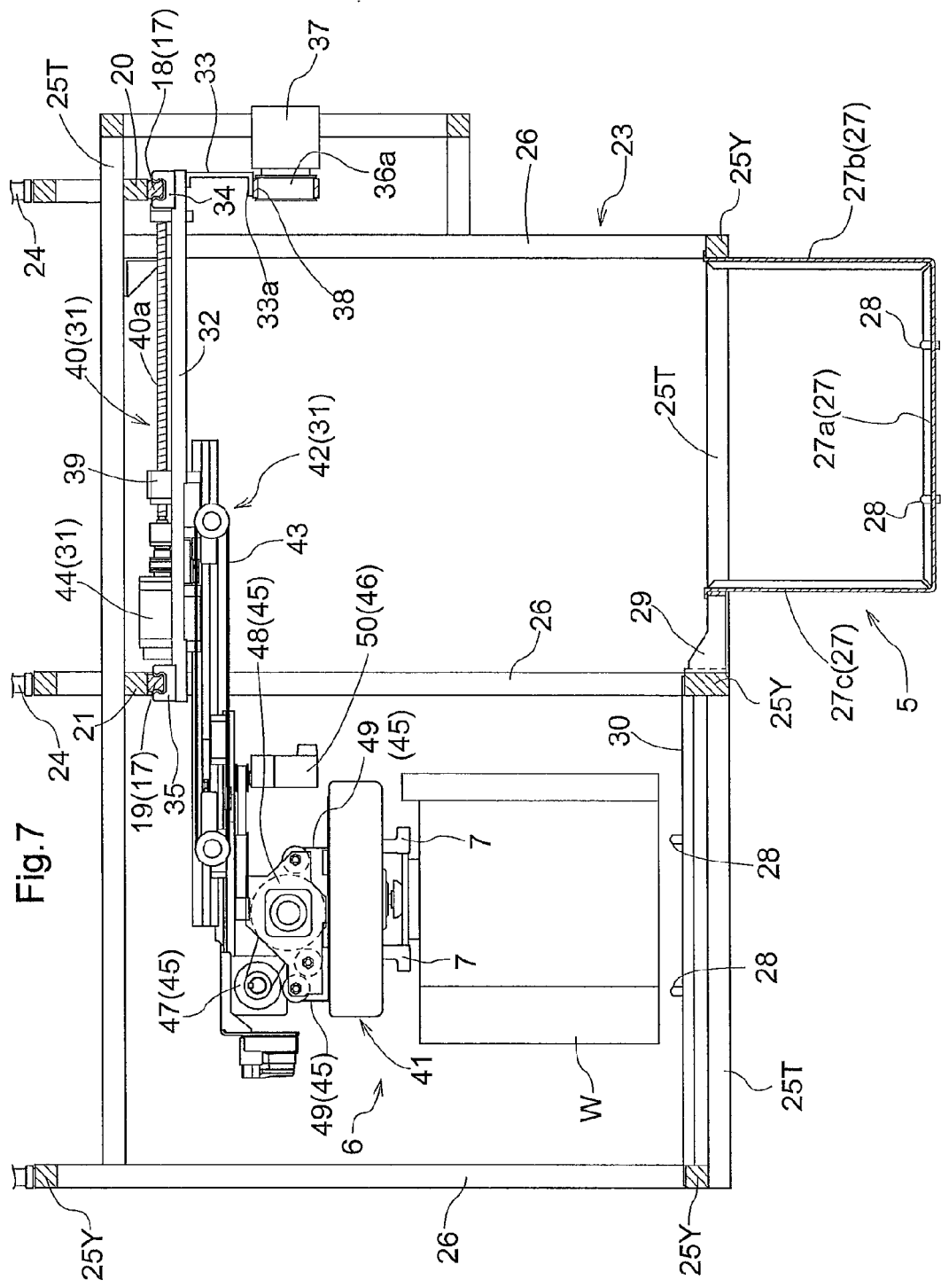
FIG. 7 is a vertical sectional front view showing a transfer operation to or from a reserve intermediate rack by the intermediate transfer device in accordance with the first embodiment of the present invention.

As shown in FIGS. 7 and 8, a ball screw 40 that can move a guide block 39 along the transfer device lateral direction is provided on the top surface of the movement base 32 of the intermediate transfer device 6. The guide block 39 is connected to an end portion, on the retracting side along the projecting and retracting direction, of a base fork provided to a multi-stage slide fork 42 that projects and retracts the vertical movement support body 41 in the transfer device lateral direction. Each stage of the slide fork 42 is engaged with each other by a linear motion guiding mechanism, is operatively connected to each other by a linking belt 43, and is configured to project and retrieve the vertical movement support body 41, which is connected to the primary fork through the vertical movement operation means 45 and the turning operation means 46, by the projecting and retracting operation of the base fork. And the guide block 39 can be moved and reciprocated along the transfer device lateral direction by drivingly rotating the lateral movement motor 44 which drivingly rotates the screw 40a of the ball screw 40 in forward and reverse directions. Thus, the lateral movement motor 44, the ball screw 40, and the slide fork 42 defines the lateral movement operation means 31 for laterally moving the transfer device grip portion 7 of the intermediate transfer device 6, in the transfer device lateral direction.

The vertical movement operation means 45 is configured to be able to vertically move the vertical movement support body 41 by rotating a rotating drum 48 by drivingly rotating the vertical movement motor 47 in the forward and reverse directions to feed out and spool the spool belt 49. The turning operation means 46 drivingly rotates the turning motor 50 to turn or rotate the transfer device grip portion 7 about a vertical axis. This allows the attitude of the article W in plan view can be adjusted into a proper attitude with respect to the station 4, the intermediate racks 5, and the reserve intermediate racks 30.

Figure 9:
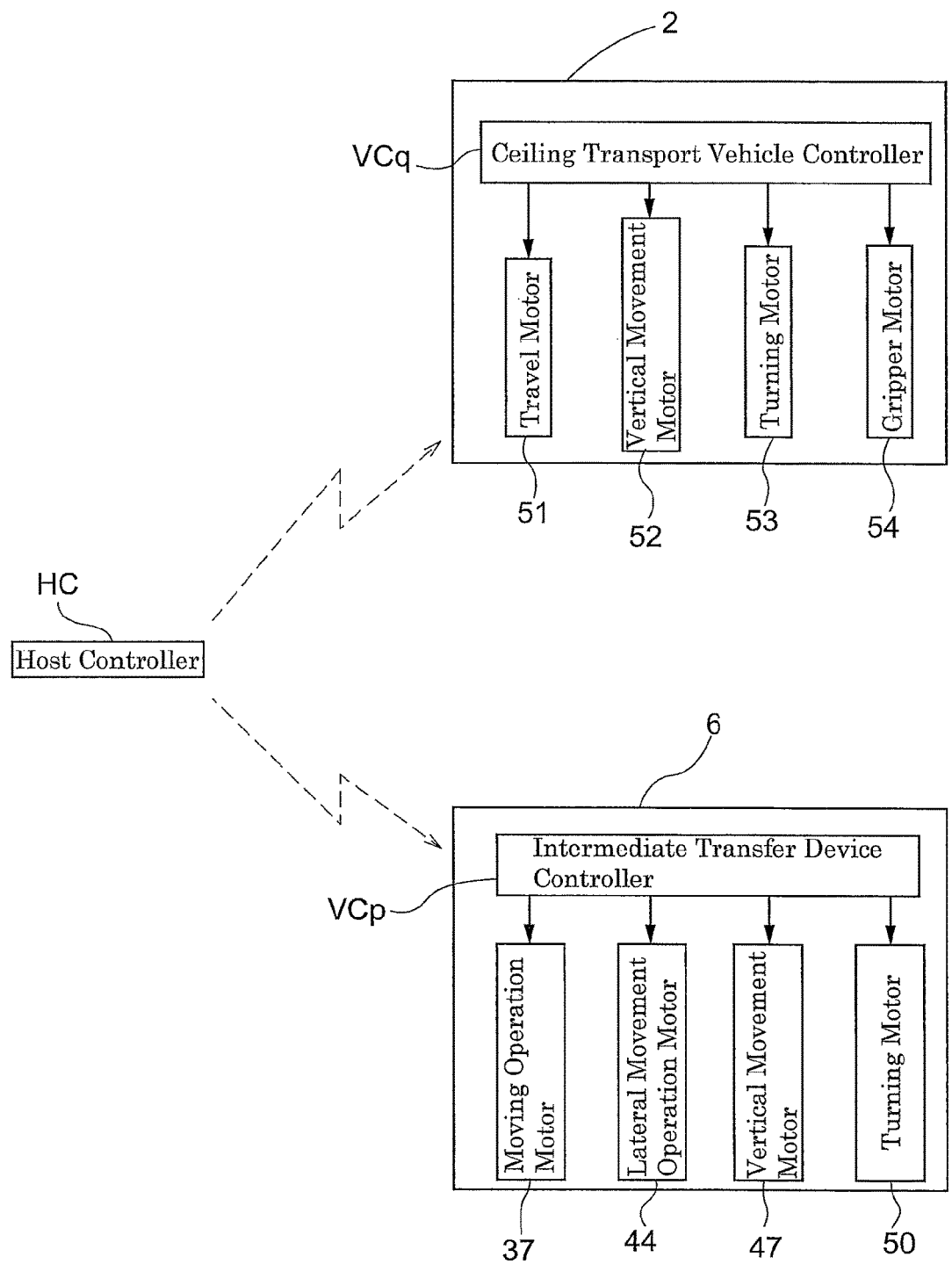
FIG. 9 is a control block diagram in accordance with the first embodiment of the present invention.

As shown in FIG. 9, a ceiling transport vehicle controller VCq which controls the traveling operation of the travel portion 10 and the article transfer operation of the main body portion 11 is mounted on the ceiling transport vehicle 2. And an intermediate transfer device controller VCp which controls the travel operation and the article transfer operation is mounted on the intermediate transfer device 6. The ceiling transport vehicle controller VCq and the intermediate transfer device controller VCp control various kinds of operations based on control commands from the host controller HC installed on the ground side. In other words, control means for controlling the travel operation of the intermediate transfer device 6 includes the host controller HC and the intermediate transfer device controller VCp.

When the ceiling transport vehicle 2 transfers an article W to or from an article delivering and receiving position in the station 4, or an intermediate rack 5, and when the intermediate transfer device 6 is located below at a position where it would interfere with the transferring, the host controller HC and the intermediate transfer device controller VCp cause the intermediate transfer device 6 to be moved to a transfer position that is determined to avoid reducing the efficiency at which the articles W are transported to the greatest degree, based on the present state of operation and the future operation schedule of the intermediate transfer device 6, among the transfer positions that are located at positions different from the article delivering and receiving position or the intermediate rack 5 that are the transfer target of the ceiling transport vehicle 2 in the travel direction, in order to move or clear the intermediate transfer device 6 off from the vertical movement path of the vertical movement support body 22 of the ceiling transport vehicle 2. In addition, when the intermediate transfer device 6 is not located at a position where it would interfere or get in the way downwardly of or below the ceiling transport vehicle 2, the intermediate transfer device 6 is caused to stand by at the present position or to be moved to a transfer position that is located at a position different from the article delivering and receiving position or the intermediate rack 5 that are the transfer target of the ceiling transport vehicle 2 in the travel direction, based on the present state of operation and the future operation schedule of the intermediate transfer device 6.

For example, when the ceiling transport vehicle 2 transfers an article W to or from the station 4 while stopped at the first stop position Q1a for the delivering and receiving portion, the intermediate transfer device 6 moves to a transfer position other than the first transfer position P1a for the delivering and receiving portion in order to avoid interfering with the transfer operation of the ceiling transport vehicle 2. If, at this time, the intermediate transfer device 6 does not hold an article W, and if an article W, that had been processed, has been brought out to the article delivering and receiving position located directly below the third transfer position P1c for the delivering and receiving portion among the three article delivering and receiving positions in the station 4 for the article processing device 8, then the third transfer position P1c for the delivering and receiving portion is selected as the transfer-time retracted position P3 to receive this article W with the intermediate transfer device 6. Or, when the ceiling transport vehicle 2 transfers an article W to or from the station 4 while stopped at the first stop position Q1a for the delivering and receiving portion, if the intermediate transfer device 6 does not hold an article W and if there is a receiving request for an article W temporarily stored in the intermediate rack 5 that corresponds to the first transfer position P2a for the intermediate rack, then the first transfer position P2a for the intermediate rack is selected as the transfer-time retracted position P3 to receive this article W with the intermediate transfer device 6.

And for example, when the ceiling transport vehicle 2 transfers an article W to or from an intermediate rack 5 while stopped at the first stop position Q2a for the intermediate rack, the intermediate transfer device 6 moves to a transfer position other than the first transfer position P2a for the intermediate rack in order to avoid interfering with the transfer operation of the ceiling transport vehicle 2. If, at this time, the intermediate transfer device 6 does not hold an article W, and if an article W, that had been processed, has been brought out to the article delivering and receiving position located directly below the third transfer position P1c for the delivering and receiving portion among the three article delivering and receiving positions in the station 4 for the article processing device 8, then the third transfer position P1c for the delivering and receiving portion is selected as the temporary-storage-time retracted position P4 to receive this article W with the intermediate transfer device 6. Or when the ceiling transport vehicle 2 transfers an article W to or from an intermediate rack 5 while stopped at the first stop position Q2a for the intermediate rack, if the intermediate transfer device 6 does not hold an article W, and if there is a receiving request for the article W that is temporarily stored in the intermediate rack 5 that corresponds to the second transfer position P2b for the intermediate rack (i.e., the intermediate rack 5, of the two intermediate racks 5, that is different from the intermediate rack 5 that is the transfer target of the ceiling transport vehicle 2), then the second transfer position P2*b* for the intermediate rack is selected as the temporary-storage-time retracted position P4 in order to receive this article W with the intermediate transfer device 6.

As described above, when the ceiling transport vehicle 2 transfers an article W to or from an article delivering and receiving position in the station 4 or an intermediate rack 5, if the intermediate transfer device 6 is located at position where it would interfere or get in the way downwardly of, or below, the ceiling transport vehicle 2, and if there is an article W which should be received by the intermediate transfer device 6, the transfer position P1 for the delivering and receiving portion or the transfer position P2 for the intermediate rack is selected as the retracted position (the transfer-time retracted position P3 or the temporary-storage-time retracted position P4) depending on the position of the article W in question that needs to be received.

And in the present embodiment, if the intermediate transfer device 6 is located at a position where it would interfere or get in the way downwardly of, or below, the ceiling transport vehicle 2 but if there is no article W which needs be received with the intermediate transfer device 6, then the host controller HC and the intermediate transfer device controller VCp are configured to control the travel operation of the intermediate transfer device 6, basically, such that, when the ceiling transport vehicle 2 transfers an article W to or from an article delivering and receiving position in the station 4, the intermediate transfer device 6 is caused to stand by at a transfer position P2 for the intermediate rack that serves as the transfer-time retracted position P3 (i.e., the intermediate transfer device 6 is caused to be retracted by selecting a transfer position P2 for the intermediate rack as the transfer-time retracted position P3), and such that, when the ceiling transport vehicle 2 transfers an article W to or from an intermediate rack 5, the intermediate transfer device 6 is caused to stand by at a transfer position P1 for the delivering and receiving portion that serves as the temporary-storage-time retracted position P4 (i.e., the intermediate transfer device 6 is caused to be retracted by selecting a transfer position P1 for the delivering and receiving portion as the temporary-storage-time retracted position P4).

In other words, in the present embodiment, if the intermediate transfer device 6 is located at a position where it would interfere or get in the way, downwardly of, or below, the ceiling transport vehicle 2, and if there is no article W which should be received with the intermediate transfer device 6, then basically, a transfer position P2 for the intermediate rack is selected when selecting the transfer-time retracted position P3, and a transfer position P1 for the delivering and receiving portion is selected when selecting the temporary-storage-time retracted position P4. Or, a transfer position P2 for the intermediate rack may be selected when selecting the transfer-time retracted position P3, and a transfer position P1 for the delivering and receiving portion may be selected when selecting the temporary-storage-time retracted position P4 regardless of whether there is an article W that needs to be received with the intermediate transfer device 6.

In accordance with the present embodiment, the intermediate racks 5 and the intermediate transfer device 6 that can transfer an article W to or from the intermediate racks 5 and to or from the station 4 are provided. Thus, when articles W cannot be directly delivered to the station 4 from the ceiling transport vehicle 2 because the station 4 is full, the ceiling transport vehicle 2 temporarily stores the article W on an intermediate rack 5, and the article W that has been temporarily stored is moved to a reserve intermediate rack 30 by the intermediate transfer device 6, after which the article W in question is then transferred to the station 4 afterward. Or the article W that was temporarily stored on the intermediate rack 5 by the ceiling transport vehicle 2 can be transferred directly to the station 4 by the intermediate transfer device 6. Accordingly, traffic congestion of the ceiling transport vehicles 2 can be prevented since it is not necessary for the ceiling transport vehicle or vehicles 2 holding an article W to wait until the station 4 has an empty space.

And the pair of lower guide rails 18, 19 that function as the guiding support 17 which supports the intermediate transfer device 6 and guides its movement along the travel direction are configured to form, or define, a space through which the grip portion 3 and an article W can pass in the vertical direction when the ceiling transport vehicle 2 transfers the article W while stopped at a stop position Q1 for the delivering and receiving portion and a stop position Q2 for the intermediate rack. Thus, the article W can pass between the pair of lower guide rails 18, 19 so that the ceiling transport vehicle 2 can transfer the article W directly to or from the station 4, as long as the intermediate transfer device 6 is retracted or moved away. Thus, the article transport facility is one which can transport articles smoothly in a manner that is responsive to various transfer requests issued by the station 4.

Second Embodiment

The second embodiment of the article transport facility in accordance with the present invention is described next. The present embodiment has the same configuration as the first embodiment except for the configuration of the buffer frame 23 in the first embodiment and also for the moving range, of the intermediate transfer device 6, which is different. Therefore, the ceiling transport vehicle 2 or the intermediate transfer device 6 will not be described in detail below. And it is to be understood that features that are not specifically described are identical to those in the first embodiment.

Figure 10:
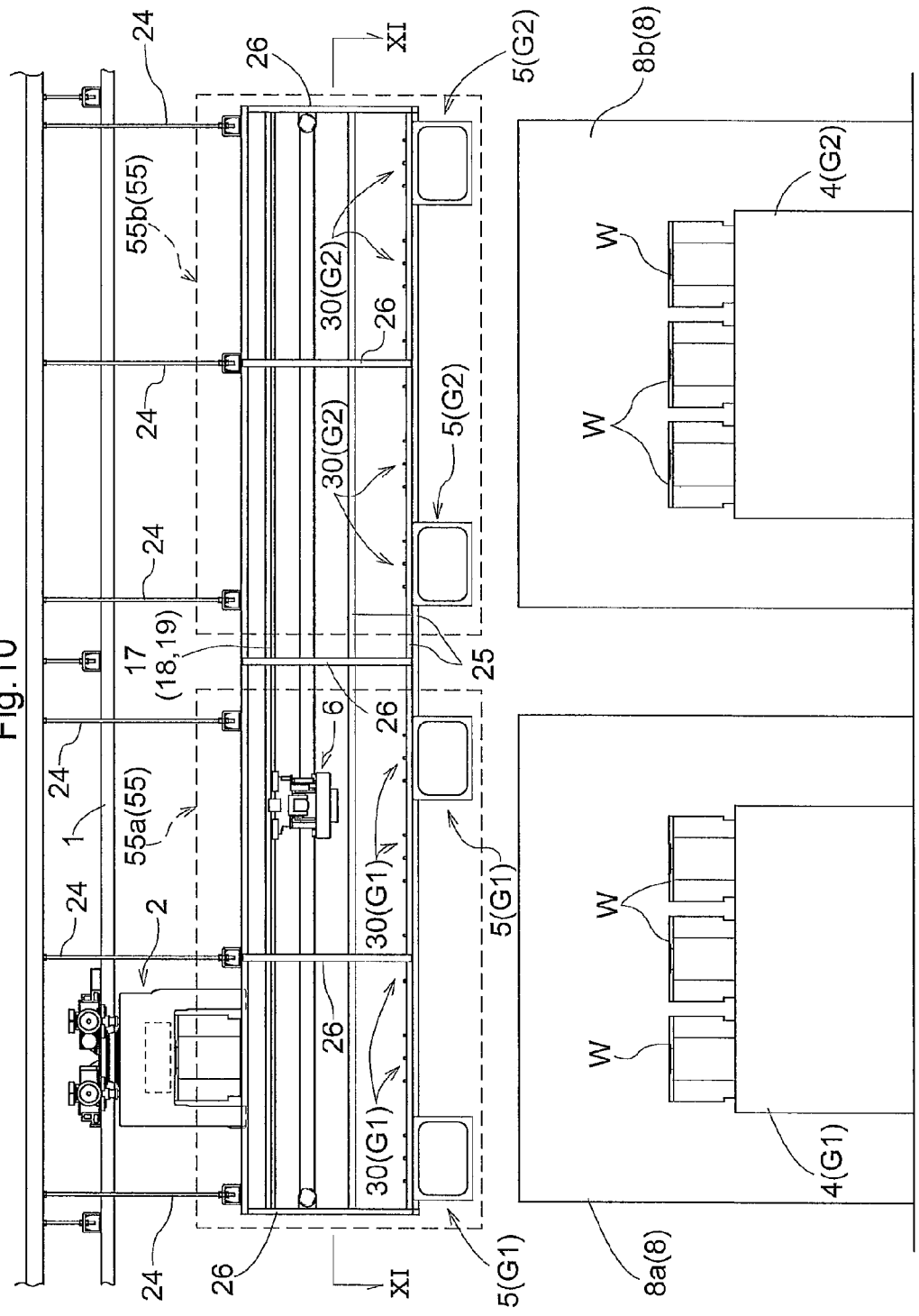
FIG. 10 is a side view of an article transport facility in accordance with the second embodiment of the present invention.

As shown in FIG. 10, two article processing devices 8 are arranged next to each other in the travel direction of the ceiling transport vehicle 2 in the present embodiment. The travel direction of the ceiling transport vehicle 2 is directed from left to right on the paper in FIG. 10. The article processing device 8 located on the left-hand side on the paper in FIG. 10 (upstream side with respect to the travel direction) is the first processing device 8*a* whereas the article processing device 8 located on the right-hand side (downstream side with respect to the travel direction) is the second processing device 8*b*. An article W on which the first processing device 8*a* completed its process is processed by the second processing device 8*b* for the subsequent process.

Similar to the first embodiment, provided to each of the first processing device 8*a* and the second processing device 8*b* is a station 4 that functions as an article delivering and receiving portion which articles W to be processed by the article processing device 8 is delivered from and received by. And the station 4 is configured such that a maximum of three articles W arranged in a rowan the travel direction can be supported or placed on it. In other words, three article delivering and receiving positions are defined or set in the station 4.

Figure 11:
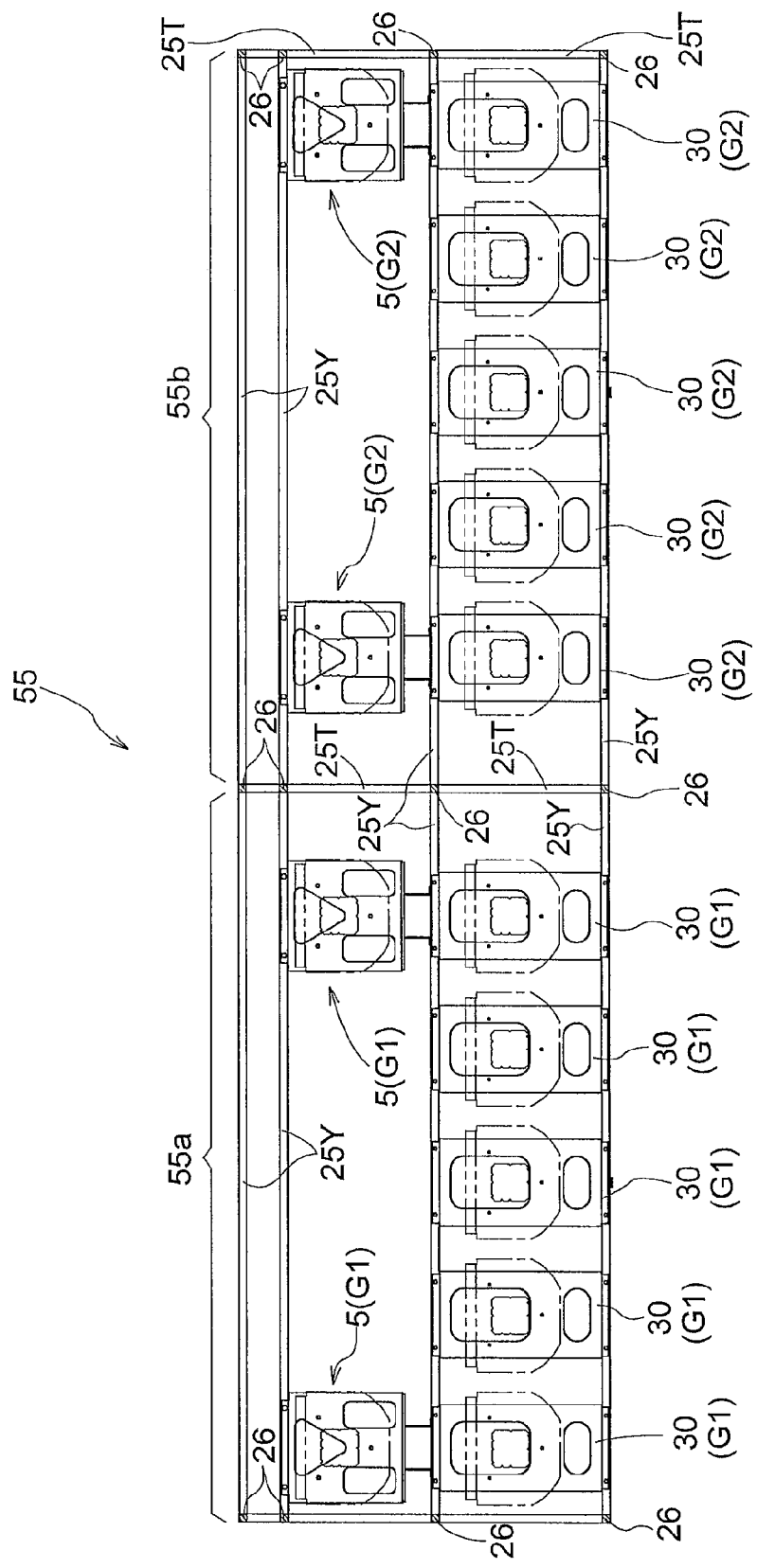
FIG. 11 is a plan view as seen along the arrows XI-XI in FIG. 10.

As shown in FIG. 10, a buffer frame 55 is disposed to extend between locations above each of the first processing device 8*a* and the second processing device 8*b*. The buffer frame 55 is formed by horizontal members 25 that are spaced apart from each other in the vertical direction and vertical members 26 that connect the horizontal members 25 at locations in the lateral direction and in the travel direction of the ceiling transport vehicle 2. And the buffer frame 55 is suspended from, and supported by, the ceiling by a plurality of rack suspensions 24. As shown in FIG. 11, the horizontal member 25 is formed with a frame that is formed by connecting to each other a plurality of lateral horizontal members 25Y and perpendicular horizontal members 25T arranged in parallel to each other at three locations, i.e., forward end portion, intermediate portion, and rear end portion in the travel direction. As such, although the fundamental configuration of the buffer frame 55 is the same as that of the buffer frame 23 in the first embodiment, its length in the travel direction is longer than twice the length of the buffer frame 23 in the first embodiment so that the moving range of the intermediate transfer device 6 is extended.

Figure 12:
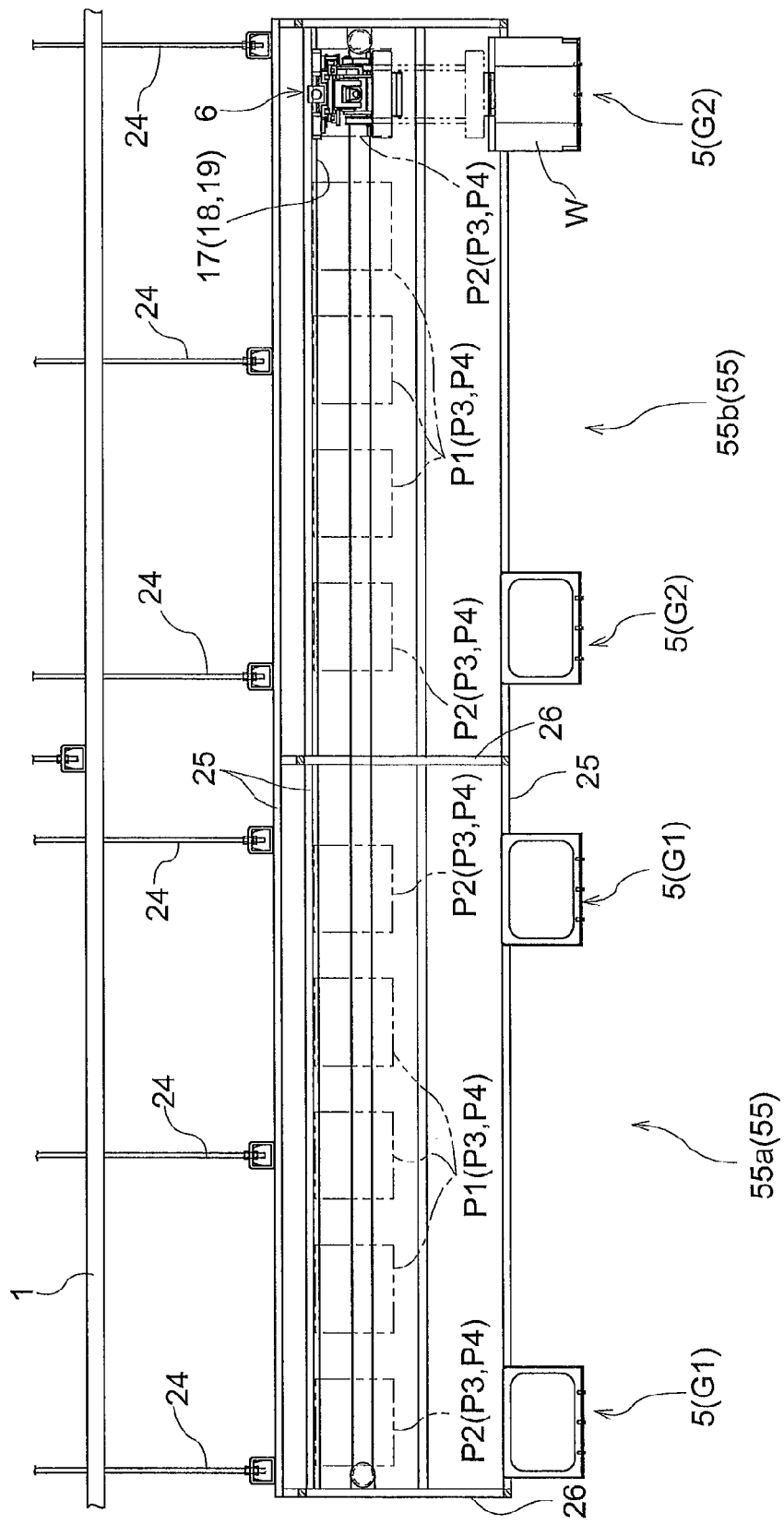
FIG. 12 is a side view showing a transfer position of an intermediate transfer device in accordance with the second embodiment of the present invention.

As also shown in FIG. 12, the buffer frame 55 includes two intermediate racks 5 and five reserve intermediate racks 30 in each of the upstream-side portion 55*a* located on the upstream side in the travel direction and the downstream-side portion 55*b* located on the downstream side, and thus has a configuration that two of the buffer frame 23 in the first embodiment are placed next to each other in the travel direction.

As shown in FIGS. 10 and 12, the first transfer target group G1, as a set of a transfer target group for the first processing device 8*a*, includes, or is defined by, the two intermediate racks 5 and the five reserve intermediate racks 30 in the upstream-side portion 55*a* of the buffer frame 55 as well as the station 4 in the first processing device 8*a*. Similarly, the second transfer target group G2, as a set of a transfer target group for the second processing device 8*b*, includes, or is defined by, the two intermediate racks 5 and the five reserve intermediate racks 30 in the downstream-side portion 55*b* of the buffer frame 55 as well as the station 4 in the second processing device 8*b*. In other words, a set of transfer target group is provided to each of the first processing device 8*a* and the second processing device 8*b*.

As shown in FIG. 12, the pair of lower guide rails 18, 19, that function as the guiding support 17 that guides the movement of the intermediate transfer device 6 along the travel direction, are disposed to extend over the length of the upstream-side portion 55*a* and the downstream-side portion 55*b*. In other words, the guiding support 17 is configured to guide the movement of the intermediate transfer device 6 among the first transfer target group G1 and the second transfer target group G2, along the travel direction of the ceiling transport vehicle 2. That is, the guiding support 17 is configured to guide the movement of the intermediate transfer device 6 for each of the transfer target groups (two groups are provided in the present example) and also to guide the movement of the intermediate transfer device 6 between the two transfer target groups that are located next to each other in the travel direction.

When the intermediate transfer device 6 transfers an article W to or from the station 4 of the first processing device 8*a* among the transfer targets that are included in the first transfer target group G1, it transfers the article W while stopped at a transfer position P1 for the delivering and receiving portion in the upstream-side portion 55*a* of the buffer frame 55. Also, when the intermediate transfer device 6 transfers an article W to or from the station 4 of the second processing device 8*b* among the transfer targets that are included in the second transfer target group G2, it transfers the article W while stopped at a transfer position P1 for the delivering and receiving portion in the downstream-side portion 55*b* of the buffer frame 55.

In addition, similar to the first embodiment, three positions, i.e., the first transfer position P1*a* for the delivering and receiving portion to the third transfer position P1*c* for the delivering and receiving portion, are defined in correspondence with the three article delivering and receiving positions in the station 4, as the transfer positions P1 for the delivering and receiving portion in the upstream-side portion 55*a* of the buffer frame 55, and the same for the transfer positions P1 for the delivering and receiving portion in the downstream-side portion 55*b*. The intermediate transfer device 6 stops at a transfer position for the delivering and receiving portion, among these positions, that corresponds to the article delivering and receiving position that is designated as the transfer target.

When transferring an article W to or from an intermediate rack 5 in the upstream-side portion 55*a*, the intermediate transfer device 6 transfers the article W while stopped at a transfer position P2 for the intermediate rack in the upstream-side portion 55*a* of the buffer frame 55, among the transfer targets that are included in the first transfer target group G1. Also, when transferring an article W to or from an intermediate rack 5 in the downstream-side portion 55*b*, the intermediate transfer device 6 transfers the article W while stopped at a transfer position P2 for the intermediate rack in the downstream-side portion 55*b* of the buffer frame 55, among the transfer targets that are included in the second transfer target group G2.

In addition, similar to the first embodiment, two positions, i.e. the first transfer position P2*a* for the intermediate rack and the second transfer position P2*b* for the intermediate rack, are defined to correspond to each intermediate rack 5 and as the transfer positions P2 for the intermediate racks in the upstream-side portion 55*a* of the buffer frame 55 and in the downstream-side portion 55*b*. The intermediate transfer device 6 stops at the transfer position P2 for intermediate racks, among these positions, that corresponds to the intermediate rack 5 that is designated as the transfer target.

When the ceiling transport vehicle 2 transfers an article W to or from the station 4 of the first processing device 8*a* among the transfer targets that define the first transfer target group G1, or when temporarily storing the article W in an intermediate rack 5 in the upstream-side portion 55*a* of the buffer frame 55, the intermediate transfer device 6 selects, as a retracted position, or as a transfer position for moving out of the way or retracting, a transfer position (among the transfer positions P1 for the delivering and receiving portion or the transfer positions P2 for the intermediate racks in the upstream-side portion 55*a* and the downstream-side portion 55*b* of the buffer frame 55) that is different from the stop position Q1 for the delivering and receiving portion or the stop position Q2 for the intermediate rack in the upstream-side portion 55*a* at which the ceiling transport vehicle 2 in question is stopped in the travel direction. That is, each of the transfer positions P1 for the delivering and receiving portion and the transfer positions P2 for the intermediate racks in the upstream-side portion 55*a* and the downstream-side portion 55*b* can also function as any of the transfer-time retracted position P3 and the temporary-storage-time retracted position P4.

Thus, in accordance with the present embodiment, since the intermediate transfer device 6 can move between the transfer target groups G1 and G2 for the respective two article processing devices 8, the intermediate transfer device 6 can transfer an article W to or from not only the station 4 and the intermediate racks 5 in the first transfer target group G1 but also those in the second transfer target group G2. Therefore, articles W can be transferred to all of the stations 4 and of the intermediate racks 5 in each of the plurality of transfer target groups by providing a fewer number (one in the present example) of the intermediate transfer devices 6 than the number of the transfer target groups (two in the present example) without having to provide a separate intermediate transfer device 6 for each of the plurality of transfer target groups (the first transfer target group G1 and the second transfer target group G2 in the present example). Thus, the number of the intermediate transfer devices 6 that need to be installed is reduced by installing only one intermediate transfer device 6 that is used in the two transfer target groups without having to install an intermediate transfer device 6 in each of the two transfer target groups, namely the first transfer target group G1 and the second transfer target group G2.

In addition, since the intermediate transfer device 6 can move between the transfer target groups G1 and G2 for the respective first processing device 8a and the second processing device 8b, when transporting an article W for which the processing by the first processing device 8a has been completed to a transfer target (the station 4 for example) in the transfer target group for the second processing device 8b, the article W can be transported by the intermediate transfer device 6 instead of transporting the article W to be transported with the ceiling transport vehicle 2. This can reduce the transporting load of the ceiling transport vehicle 2.

Third Embodiment

The third embodiment of the article transport facility in accordance with the present invention is described next. The present embodiment differs from the second embodiment described above in that the buffer frame 55 is provided with two intermediate transfer devices.

Figure 13:
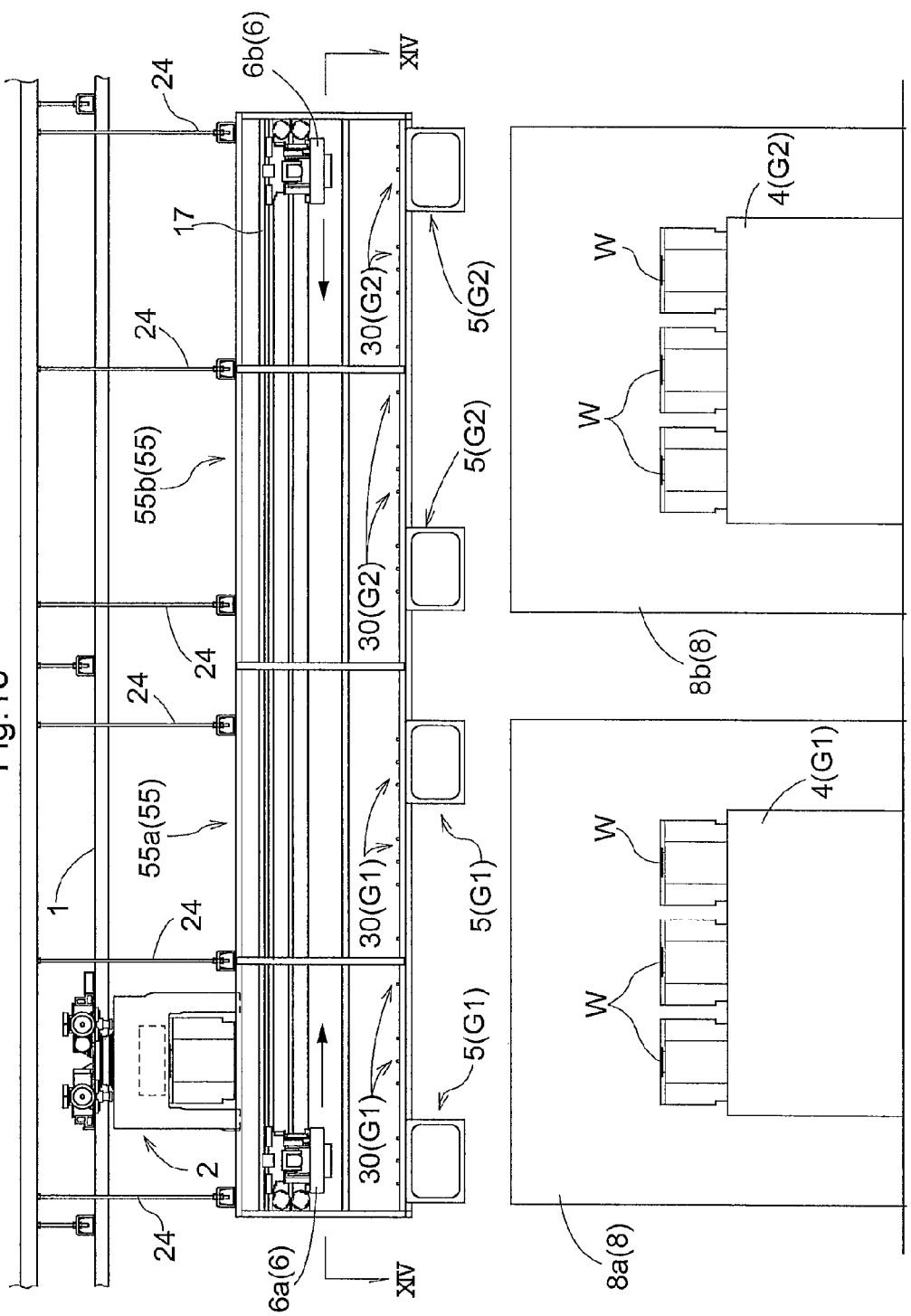
FIG. 13 is a side view of an article transport facility in accordance with the third embodiment of the present invention.
Figure 14:
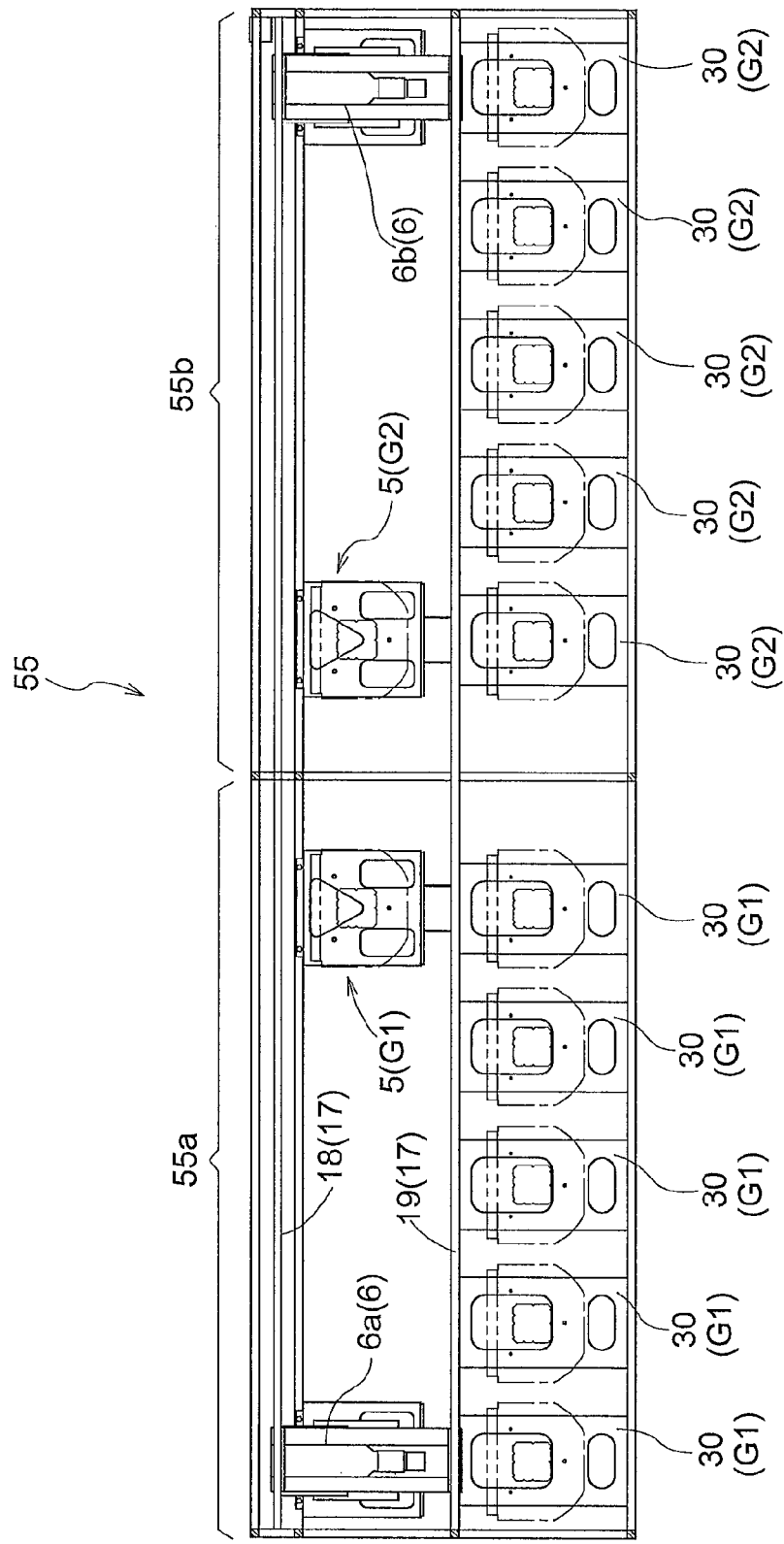
FIG. 14 is a plan view as seen along the arrows XIV-XIV in FIG. 13.

As shown in FIGS. 13 and 14, there are provided a first intermediate transfer device 6a which is assigned to, or in charge of, article transfers to or from the transfer target group G1 for the first processing device 8a, and a second intermediate transfer device 6b which is assigned to, or in charge of, article transfers to or from the transfer target group G2 for the second processing device 8b. Each of the first intermediate transfer device 6a and the second intermediate transfer device 6b is supported by a pair of lower guide rails 18, 19 that function as the guiding support 17 provided in the buffer frame 55 such that its movement in the travel direction is guided by the lower guide rails 18, 19. As such, the guiding support 17 is configured to guide the movements of the intermediate transfer devices 6a, 6b such that each intermediate transfer device 6a or 6b can move to the first transfer target group G1 which the first intermediate transfer device 6a is assigned to, or in charge of, and to the second transfer target group G2 which the second intermediate transfer device 6b, which is an intermediate transfer device 6 that is provided separately from, and in addition to, the first intermediate transfer device 6a, is assigned to, or in charge of. That is, the guiding support 17 is configured to guide the movement of the intermediate transfer device 6, that is provided for each transfer target groups, for each of the plurality (two in the present example) of the transfer target groups, and to guide the movement of each intermediate transfer device 6 between the two transfer target groups which are located next to each other in the travel direction.

The configuration for effecting the moving operation of each of the first intermediate transfer device 6a and the second intermediate transfer device 6b is identical to that in the first embodiment. The first intermediate transfer device 6a and the second intermediate transfer device 6b are configured to be moved individually by disposing at different heights a moving operation timing belt 38 that has a vertically oriented circulating plane and that performs the moving operation of the first intermediate transfer device 6a and a moving operation timing belt 38 that has a vertically-oriented circulating plane and that performs the moving operation of the second intermediate transfer device 6b, and by individually driving and rotating a toothed drive pulley 36a having a laterally extending axis and provided for each timing belt 38.

In accordance with the present embodiment, when there is high transfer demand in or for the second transfer target group G2, transfers of articles W to or from the station 4 and the intermediate racks 5 in the second transfer target group G2 for which there is high transfer demand can be performed swiftly by causing the first intermediate transfer device 6a that is assigned to, or in charge of, the first transfer target group G1 to be moved to the downstream-side portion 55b in the buffer frame 55 to have the two intermediate transfer devices 6 to focus on performing article transfers to or from the station 4 and the intermediate racks 5 in the second transfer target group G2. Conversely, when there is high transfer demand in or for the first transfer target group G1, transfers of articles W to or from the station 4 and the intermediate racks 5 in the first transfer target group G1 for which there is high transfer demand can be performed swiftly by causing the second intermediate transfer device 6b that is assigned to, or in charge of, the second transfer target group G2 to be moved to the upstream-side portion 55a in the buffer frame 55 to have the two intermediate transfer devices 6 to focus on performing article transfers to or from the station 4 and the intermediate racks 5 in the first transfer target group G1.

Alternative Embodiments

Alternative embodiments of the present invention are described next.

(1) In the first, second, and the third embodiments described above, the examples are described in which the transfer positions P1 for the delivering and receiving portion and the transfer positions P2 for the intermediate racks are located or disposed next to one another in the travel direction. However, a configuration may be adapted in which the transfer positions P1 for the delivering and receiving portion and the transfer positions P2 for the intermediate racks may be spaced apart from one another in the travel direction. In this case; the transfer-time retracted position P3 and the temporary-storage-time retracted position P4 may be defined or set at positions that are different from the transfer positions P1 for the delivering and receiving portion and the transfer positions P2 for the intermediate racks in the travel direction.

(2) In the first, second, and the third embodiments described above, examples are described in which plurality of positions are defined for the stop positions Q1 for the delivering and receiving portion, the stop positions Q2 for the intermediate racks, the transfer positions P1 for the delivering and receiving portion, and the transfer positions P2 for the intermediate racks. However, one position may be defined for some or all of these stop positions and/or the transfer positions.

(3) In the first, second, and the third embodiments described above, examples are described in which one ceiling transport vehicle 2 is provided in the lateral direction.

However, the invention is not limited to this configuration. For example, additional travel rails may be provided separately from the travel rails 1 in the embodiments described above at the same height as and parallel to those in the embodiments described above and so located to be in vertical alignment, or overlap vertically, with the reserve intermediate racks 30. And a second ceiling transport vehicle 2 that can travel along the additional travel rails may be provided. In this case, the second ceiling transport vehicle may be configured to transfer articles W to or from the reserve intermediate racks 30.

(4) In the second and the third embodiments described above, examples are described in which two article processing devices 8 are provided as the plurality of article processing devices 8. However, three or more article processing devices 8 may be provided in a row in the travel direction. And it may be configured such that the movements of one or more intermediate transfer devices 6 may be guided between and among the transfer target groups for all these article processing devices 8.

(5) In the second and the third embodiments described above, examples are described in which the article processing devices 8 that perform different processes on the articles W are described as the plurality of article processing devices 8. However, the invention is not limited to this. And a configuration may be adapted in which the plurality of article processing devices 8 perform the same process on the articles W.

(6) In the third embodiment described above, an example is described in which the movements of the first intermediate transfer device 6a and the second intermediate transfer device 6b are guided by the same guiding support 17 at the same height. Instead, a configuration may be adapted in which a separate guiding support 17 is provided exclusively for each of the first intermediate transfer device 6a and the second intermediate transfer device 6b to guide the movement for each at a different height. In this case, articles W can be transferred to all of the transfer targets in the first transfer target group G1 and the second transfer target group G2 by either of the first intermediate transfer device 6a and the second intermediate transfer device 6b by allowing the first intermediate transfer device 6a and the second intermediate transfer device 6b to be located relative to each other such that they are in alignment, or overlap, with each other in plan view.

(7) In the third embodiment described above, an example is described in which two intermediate transfer devices, namely, the first intermediate transfer device 6a and the second intermediate transfer device 6b, are provided as the plurality of intermediate transfer devices. However, the invention is not limited to this. And a configuration may be adapted in which three or more intermediate transfer devices were provided as the plurality of intermediate transfer devices.

INDUSTRIAL APPLICABILITY

The present invention may be advantageously used in an article transport facility comprising a ceiling transport vehicle that is capable of traveling along a travel rail arranged on a ceiling side, that includes a grip portion for supporting an article such that the grip portion can be vertically moved, and that is capable of transferring an article to or from an article delivering and receiving portion provided on a floor side; and an intermediate rack for temporarily storing an article to be transferred to the article delivering and receiving portion, the intermediate rack being located upwardly of the article delivering and receiving portion and downwardly of the ceiling transport vehicle.

DESCRIPTION OF REFERENCE NUMERALS AND SYMBOLS

W Article
Q1, Q1a, Q1b, Q1c Stop Positions for Delivering and Receiving Portion
Q2, Q2a, Q2b Stop Positions for Intermediate Racks
P1, P1a, P1b, P1c Transfer Position for Delivering and Receiving Portion
P2, P2a, P2b Transfer Positions for Intermediate Racks P3 Transfer-time Retracted Position
P4 Temporary-storage-time Retracted Position
HC, VCp Control Means
G1, G2 Transfer Target Group
1 Travel Rail
2 Ceiling Transport Vehicle
3 Grip Portion
4 Article Delivering and Receiving Portion
5 Intermediate Rack
6 Intermediate Transfer Device
7 Transfer Device Grip Portion
17 Guiding Support
18, 19 Pair of Lower Guide Rails
30 Reserve Intermediate Rack
31 Lateral Movement Operation Means

The invention claimed is:

1. An article transport facility comprising:
a ceiling transport vehicle that includes a grip portion for supporting an article such that the grip portion can be vertically moved;
a travel rail located at a position higher than an article delivering and receiving portion to guide a movement of the ceiling transport vehicle so as to form a traveling track for the ceiling transport vehicle passing above the article delivering and receiving portion;
an intermediate transfer device that includes a transfer device grip portion for supporting an article such that the transfer device grip portion can be vertically moved;
a guiding support that is located parallel with the travel rail at a height between the article delivering and receiving portion and the travel rail to guide a movement of the intermediate transfer device so as to form a traveling track for the intermediate transfer device passing above the article delivering and receiving portion;
an intermediate rack that is located at a height between the article delivering and receiving portion and the guiding support; and
a reserve intermediate rack for supporting an article at a position adjacent to the intermediate rack in a transfer device lateral direction of the intermediate transfer device, the transfer device lateral direction being perpendicular to both the direction parallel to the traveling track for the intermediate transfer device and the vertical direction,
wherein the intermediate rack is located downwardly both of the traveling track of the ceiling transport vehicle and the traveling track of the intermediate transfer device, and is located at a position that is offset relative to the article delivering and receiving portion in a direction parallel to the traveling track for the intermediate transfer device, wherein the guiding support and the intermediate rack are supported by and suspended from a ceiling, and wherein the intermediate transfer device comprises a motor for laterally moving the transfer device grip portion in the transfer device lateral direction.

2. The article transport facility as defined in claim 1, wherein the intermediate rack is located at a height to allow the intermediate transfer device supporting an article with the transfer device grip portion to move above the intermediate rack supporting an article.

3. The article transport facility as defined in claim 1, wherein the guiding support comprises a pair of lower guide rails that are spaced apart from each other in a transfer device lateral direction of the intermediate transfer device, the transfer device lateral direction being perpendicular to both the direction parallel to the traveling track for the intermediate transfer device and the vertical direction, and wherein a distance between the pair of lower guide rails is determined to allow the grip portion supporting the article to pass through between the pair of lower guide rails in the vertical direction.

4. The article transport facility as defined in claim 1, wherein the guiding support is provided in a frame element supported by and suspended from the ceiling, and wherein the intermediate rack is fixed to the frame element.

5. The article transport facility as defined in claim 4, wherein the intermediate rack includes a portion that receives and supports the article, the portion fixedly supported by the frame element, and wherein the intermediate rack does not overlap the article delivering and receiving portion as viewed from the top.

* * * * *